(12) United States Patent
Hayoz et al.

(10) Patent No.: US 10,669,371 B2
(45) Date of Patent: Jun. 2, 2020

(54) BENZOTHIENOTHIOPHENE ISOINDIGO POLYMERS

(71) Applicant: BASF SE, Ludwigshafen (DE)

(72) Inventors: Pascal Hayoz, Hofstetten (CH); Daniel Kaelblein, Speyer (DE); Iain McCulloch, Eastleigh (GB); Wan Yue, London (GB)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 15/543,637

(22) PCT Filed: Jan. 15, 2016

(86) PCT No.: PCT/EP2016/050801
§ 371 (c)(1),
(2) Date: Jul. 14, 2017

(87) PCT Pub. No.: WO2016/113403
PCT Pub. Date: Jul. 21, 2016

(65) Prior Publication Data
US 2018/0009936 A1 Jan. 11, 2018

(30) Foreign Application Priority Data
Jan. 16, 2015 (EP) ..................................... 15151475

(51) Int. Cl.
| | | |
|---|---|---|
| C08G 61/12 | (2006.01) | |
| C09K 11/06 | (2006.01) | |
| H01B 1/12 | (2006.01) | |
| H01L 51/00 | (2006.01) | |
| H01L 51/05 | (2006.01) | |

(52) U.S. Cl.
CPC ......... *C08G 61/124* (2013.01); *C08G 61/126* (2013.01); *C09K 11/06* (2013.01); *H01B 1/127* (2013.01); *H01B 1/128* (2013.01); *H01L 51/0035* (2013.01); *H01L 51/0036* (2013.01); *H01L 51/0071* (2013.01); *C08G 2261/124* (2013.01); *C08G 2261/1412* (2013.01); *C08G 2261/3223* (2013.01); *C08G 2261/344* (2013.01); *C08G 2261/364* (2013.01); *C08G 2261/411* (2013.01); *C08G 2261/414* (2013.01); *C08G 2261/51* (2013.01); *C08G 2261/92* (2013.01); *C09K 2211/1483* (2013.01); *H01L 51/0558* (2013.01)

(58) Field of Classification Search
CPC .... C08G 2261/3243; C08G 2261/3246; C08G 61/126; C08G 2261/414; C08G 2261/91; C07D 417/14; H01L 51/0043; H01L 51/0036; H01L 51/0047; H01L 51/4253; Y02E 10/549
See application file for complete search history.

(56) References Cited

U.S. PATENT DOCUMENTS

| | | |
|---|---|---|
| 4,395,497 A | 7/1983 | Naarmann et al. |
| 2010/0297405 A1 | 12/2010 | Flores et al. |
| 2013/0193379 A1 | 8/2013 | Wigglesworth et al. |
| 2013/0220415 A1 | 8/2013 | Zhou et al. |
| 2015/0111337 A1 | 4/2015 | Welker et al. |
| 2017/0084839 A1* | 3/2017 | Nanson ................ C07D 471/04 |

FOREIGN PATENT DOCUMENTS

| | | |
|---|---|---|
| EP | 0 045 366 A1 | 2/1982 |
| WO | WO 2009/053291 A1 | 4/2009 |
| WO | WO 2013/149897 A1 | 10/2013 |

OTHER PUBLICATIONS

International Search Report dated Feb. 29, 2017 in PCT/EP2016/050801.
Hae Jung Son et al: "Synthesis and Photovoltaic Effect in Dithieno[2,3-d:2',3'-d']Benzo[1,2-b:4,5-b']dithiophene-Based Conjugated Polymers", Advanced Materials, vol. 25, No. 6 Feb. 13, 2013, XP055198573, pp. 838-843.
Jianguo Mei et al: "Synthesis of Isoindigo-Based Oligothiophenes for Molecular Bulk Heterojunction Solar Cells", Organic Letters, vol. 12, No. 4, Feb. 19, 2010, XP055080368, pp. 660-663.
Na Zhao et al: "Synthesis of a thiophene-fused isoindigo derivative: a potential building block for organic semiconductors", Tetrahedron Letters, Pergamon, GB, vol. 55, No. 5, Dec. 29, 2013, XP028817673, pp. 1040-1044.
Romain Stalder et al: "Isoindigo-Based Donor-Acceptor Conjugated Polymers", Macromolecules, vol. 43, No. 20, Oct. 26, 2010, XP055080348, pp. 8348-8352.

* cited by examiner

*Primary Examiner* — Shane Fang
(74) *Attorney, Agent, or Firm* — Oblon, McClelland, Maier & Neustadt, L.L.P.

(57) ABSTRACT

Polymers comprising at least one unit of formula (1) and their use as semiconducting materials.

(1)

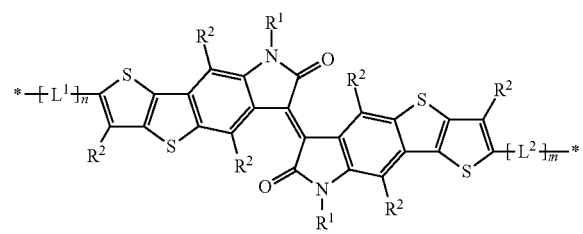

9 Claims, 6 Drawing Sheets

BENZOTHIENOTHIOPHENE ISOINDIGO POLYMERS

The present invention relates to Benzothienothiophene isoindigo polymers, to a process for the preparation of these polymers, to intermediates, to electronic devices comprising these polymers, as well as to the use of these polymers as semiconducting material.

Organic semiconducting materials can be used in electronic devices such as organic photovoltaic devices (OPVs), organic field-effect transistors (OFETs), organic light emitting diodes (OLEDs), organic photodiodes (OPDs) and organic electrochromic devices (ECDs).

It is desirable that the organic semiconducting materials are compatible with liquid processing techniques such as spin coating as liquid processing techniques are convenient from the point of processability, and thus allow the production of low cost organic semiconducting material-based electronic devices. In addition, liquid processing techniques are also compatible with plastic substrates, and thus allow the production of light weight and mechanically flexible organic semiconducting material-based electronic devices.

For application in organic photovoltaic devices (OPVs), organic field-effect transistors (OFETs), and organic photodiodes (OPDs), it is further desirable that the organic semiconducting materials show high charge carrier mobility.

For application in organic photovoltaic devices (OPVs) and organic photodiodes (OPDs), the organic semiconducting materials should also show a strong absorption of the visible light and of the near infra-red light.

The use of iso-indigo-type compounds as semiconducting materials in electronic devices is known in the art.

WO 2009/053291 describes semiconducting polymers comprising the following units

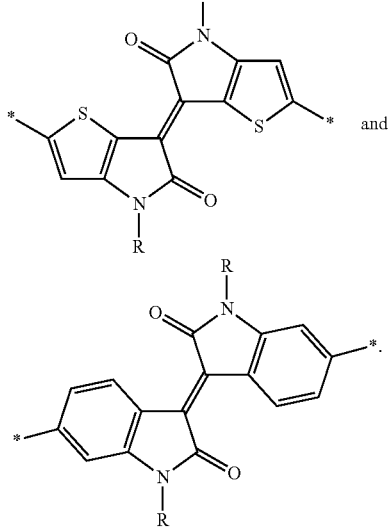

and organic field effect transistors comprising these polymers.

It was the object of the present invention to provide organic semiconducting materials. This object is solved by the polymers, the process, the intermediates, and the electronic device described below.

Figure 1:
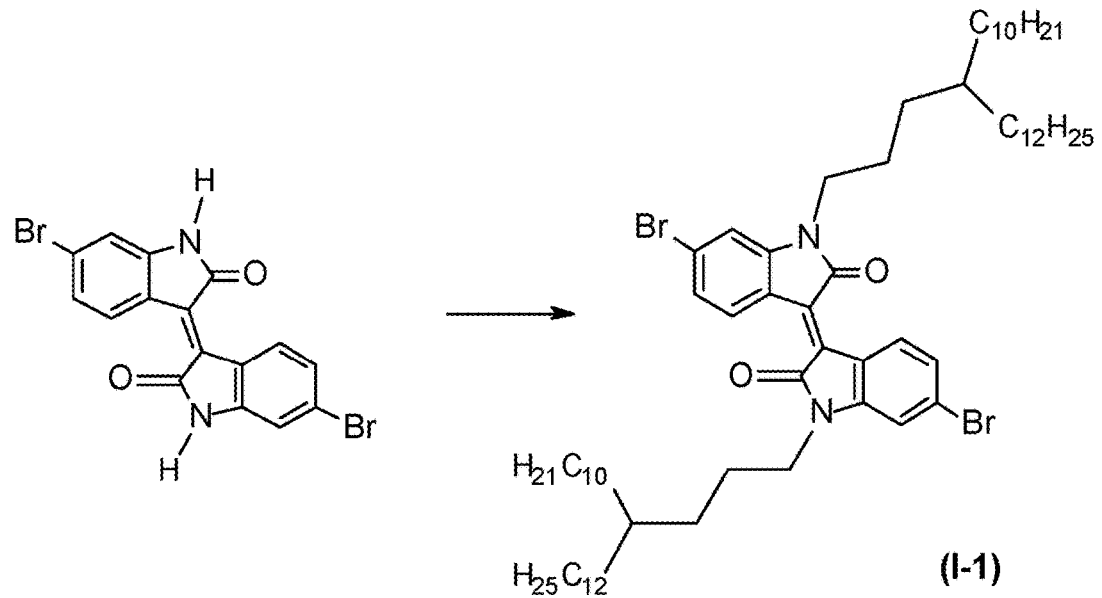
FIG. 1 shows the synthesis of compound I-1 in Examle 1 a).

The polymers of the present invention comprise at least one unit of formula

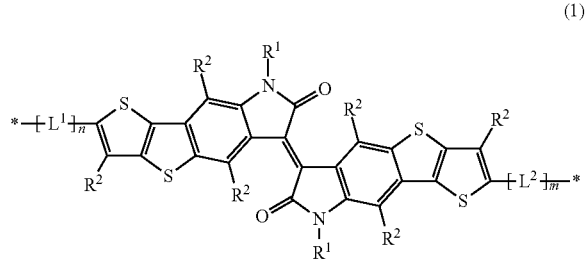

(1)

wherein $R^1$ is at each occurrence selected from the group consisting of H, $C_{1-100}$-alkyl, $C_{2-100}$-alkenyl, $C_{2-100}$-alkynyl, $C_{5-12}$-cycloalkyl, $C_{6-18}$-aryl, a 5 to 20 membered heteroaryl, $C(O)$—$C_{1-100}$-alkyl, $C(O)$—$C_{5-12}$-cycloalkyl and $C(O)$—$OC_{1-100}$-alkyl, wherein $C_{1-100}$-alkyl, $C_{2-100}$-alkenyl and $C_{2-100}$-alkynyl can be substituted with one to fourty substituents independently selected from the group consisting of $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^aR^b$, $NR^a$—$C(O)R^b$, $C(O)$—$NR^aR^b$, $N[C(O)R^a][C(O)R^b]$, $SR^a$, $Si(R^{Sia})(R^{Sib})(R^{Sic})$, —O—$Si(R^{Sia})(R^{Sib})(R^{Sic})$, halogen, CN, and $NO_2$; and at least two $CH_2$-groups, but not adjacent $CH_2$-groups, of $C_{1-100}$-alkyl, $C_{2-100}$-alkenyl and $C_{2-100}$-alkynyl can be replaced by O or S, $C_{5-12}$-cycloalkyl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^aR^b$, $NR^a$—$C(O)R^b$, $C(O)$—$NR^aR^b$, $N[C(O)R^a][C(O)R^b]$, $SR^a$, $Si(R^{Sia})(R^{Sib})(R^{Sic})$, —O—$Si(R^{Sia})(R^{Sib})(R^{Sic})$, halogen, CN, and $NO_2$; and one or two $CH_2$-groups, but not adjacent $CH_2$-groups, of $C_{5-12}$-cycloalkyl can be replaced by O, S, OC(O), CO, $NR^a$ or $NR^a$—CO, $C_{6-18}$-aryl and 5 to 20 membered heteroaryl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^aR^b$, $NR^a$—$C(O)R^b$, $C(O)$—$NR^aR^b$, $N[C(O)R^a][C(O)R^b]$, $SR^a$, $Si(R^{Sia})(R^{Sib})(R^{Sic})$, —O—$Si(R^{Sia})(R^{Sib})(R^{Sic})$, halogen, CN, and $NO_2$, wherein $R^a$ and $R^b$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl and 5 to 14 membered heteroaryl, $R^{Sia}$, $R^{Sib}$ and $R^{Sic}$ are independently selected from the group consisting of H, $C_{1-60}$-alkyl, $C_{2-60}$-alkenyl, $C_{2-60}$-alkynyl, $C_{5-18}$-cycloalkyl, $C_{6-14}$-aryl, 5 to 14 membered heteroaryl, O—$C_{1-60}$-alkyl, O—$C_{2-60}$-alkenyl, O—$C_{2-60}$-alkynyl, O—$C_{5-8}$-cycloalkyl, O—$C_{6-14}$-aryl, O-5 to 14 membered heteroaryl, —[O—$SiR^{Sid}R^{Sie}]_o$—$R^{Sif}$, $NR^5R^6$, halogen and O—C(O)—$R^5$, wherein o is an integer from 1 to 50, $R^{Sid}$, $R^{Sie}$, $R^{Sif}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, O—$C_{1-60}$-alkyl, O—$C_{2-60}$-alkenyl, O—$C_{2-60}$-alkynyl, O—$C_{5-8}$-cycloalkyl, O—$C_{6-14}$-aryl, O-5 to 14 membered heteroaryl, —[O—$SiR^{Sig}R^{Sih}]_p$—$R^{Sii}$, $NR^{50}R^{60}$, halogen and O—C(O)—$R^{50}$;

wherein is an integer from 1 to 50, $R^{Sig}$ $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, $C_{2-30}$-alkynyl, O—$C_{5-6}$-cycloalkyl, O—$C_{6-10}$-aryl, O-5 to 10 membered heteroaryl, O—$Si(CH_3)_3$, $NR^{500}R^{600}$, halogen and O—C(O)—$R^{500}$, $R^5$, $R^6$, $R^{50}$, $R^{60}$, $R^{500}$ and $R^{600}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, and 5 to 14 membered heteroaryl, $C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, $OR^c$, $OC(O)$—$R^c$, $C(O)$—$OR^c$, $C(O)$—$R^c$, $NR^cR^d$, $NR^c$—$C(O)R^d$, $C(O)$—$NR^cR^d$, $N[C(O)R^c][C(O)R^d]$, $SR^c$, $Si(R^{Sij})(R^{Sik})(R^{Sil})$, halogen, CN, and $NO_2$; and at least two $CH_2$-groups, but not adjacent $CH_2$-groups, of $C_{1-60}$-alkyl, $C_{2-60}$-alkenyl and $C_{2-60}$-alkynyl can be replaced by O or S, $C_{5-8}$-cycloalkyl can be substituted with one to five substituents selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c(O)$—$OR^c$, $C(O)$—$R^c$, $NR^cR^d$, $NR^c$—$C(O)R^d$, $C(O)$—$NR^cR^d$, $N[C(O)R^c][C(O)R^d]$, $SR^c$, $Si(R^{Sij})(R^{Sik})(R^{Sil})$, —O—$Si(R^{Sij})(R^{Sik})(R^{Sil})$, halogen, CN, and $NO_2$; and one or two $CH_2$-groups, but not adjacent $CH_2$-groups, of $C_{5-8}$-cycloalkyl can be replaced by O, S, OC(O), CO, $NR^c$ or $NR^c$—CO, $C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^cR^d$, $NR^c$—$C(O)R^d$, $C(O)$—$NR^cR^d$, $N[C(O)R^c][C(O)R^d]$, $SR^c$, $Si(R^{Sij})(R^{Sik})(R^{Sil})$, —O—$Si(R^{Sij})(R^{Sik})(R^{Sil})$, halogen, CN and $NO_2$;

wherein $R^c$ and $R^d$ are independently selected from the group consisting of H, $C_{1-30}$-alkyl, $C_{2-30}$-alkenyl and $C_{2-30}$-alkynyl, $R^{Sij}$, $R^{Sik}$ and $R^{Sil}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, —[O—$SiR^{Sim}R^{Sin}]_q$—$R^{Sio}$, $NR^7R^8$, halogen, and O—C(O)—$R^7$, wherein q is an integer from 1 to 50, $R^{Sim}$, $R^{Sin}$, $R^{Sio}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O—5 to 10 membered heteroaryl, —[O—$SiR^{Sip}R^{Siq}]_r$—$R^{Sir}$, $NR^{70}R^{80}$, halogen, and O—C(O)—$R^{70}$;

wherein r is an integer from 1 to 50, $R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, O—$Si(CH_3)_3$, $NR^{700}R^{800}$, halogen and O—C(O)—$R^{700}$, $R^7$, $R^8$, $R^{70}$, $R^{80}$, $R^{700}$ and $R^{800}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen, CN and $NO_2$, $R^2$ is at each occurrence selected from the group consisting of hydrogen, $C_{1-30}$-alkyl, $C_{2-30}$-alkenyl, $C_{2-30}$-alkynyl, $C_{5-12}$-cycloalkyl, $C_{6-18}$-aryl, 5 to 20 membered heteroaryl, $OR^{21}$, $OC(O)$—$R^{21}$, $C(O)$—$OR^{21}$, $C(O)$—$R^{21}$, $NR^{21}R^{22}$, $NR^{21}$—$C(O)R^{22}$, $C(O)$—$NR^{21}R^{22}$, $N[C(O)R^{21}][C(O)R^{22}]$, $SR^{21}$, halogen, CN, $SiR^{Sis}R^{Sit}R^{Siu}$ and OH, wherein $R^{21}$ and $R^{22}$ and are independently selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$; and at least two $CH_2$-groups, but not adjacent $CH_2$-groups, of $C_{1-30}$-alkyl, $C_{2-30}$-alkenyl and $C_{2-30}$-alkynyl can be replaced by O or S, $C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$; and one or two CH$_2$-groups, but not adjacent CH$_2$-groups, of C$_{5-12}$-cycloalkyl can be replaced by O, S, OC(O), CO, NR$^e$ or NR$^e$—CO, C$_{5-12}$-aryl and 5 to 20 membered heteroaryl can be substituted with one to six substituents independently selected from the group consisting of C$_{1-20}$-alkyl, C$_{2-20}$-alkenyl, C$_{2-20}$-alkynyl, C$_{5-8}$-cycloalkyl, C$_{6-14}$-aryl, 5 to 14 membered heteroaryl, OR$^e$, OC(O)—R$^e$, C(O)—OR$^e$, C(O)—R$^e$, NR$^e$R$^f$, NR$^e$—C(O)R$^f$, C(O)—NR$^e$R$^f$, N[C(O)R$^e$][C(O)R$^f$], SR$^e$, halogen, CN, SiR$^{Sis}$R$^{Sit}$R$^{Siu}$ and NO$_2$, wherein R$^{Sis}$, R$^{Sit}$ and R$^{Siu}$ are independently from each other selected from the group consisting of H, C$_{1-20}$-alkyl, C$_{2-20}$-alkenyl, C$_{2-20}$-alkynyl, C$_{5-6}$-cycloalkyl, phenyl and O—Si(CH$_3$)$_3$, R$^e$ and R$^f$ are independently selected from the group consisting of H, C$_{1-20}$-alkyl, C$_{2-20}$-alkenyl, C$_{2-20}$-alkynyl, C$_{5-8}$-cycloalkyl, C$_{6-14}$-aryl, and 5 to 14 membered heteroaryl, wherein C$_{1-20}$-alkyl, C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^g$, OC(O)—R$^g$, C(O)—OR$^g$, C(O)—R$^g$, NR$^g$R$^h$, NR$^g$—C(O)R$^h$, C(O)—NR$^g$R$^h$, N[C(O)R$^g$][C(O)R$^h$], SR$^g$, halogen, CN, and NO$_2$;

C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^g$, OC(O)—R$^g$, C(O)—OR$^g$, C(O)—R$^g$, NR$^g$R$^h$, NR$^g$—C(O)R$^h$, C(O)—NR$^g$R$^h$, N[C(O)R$^g$][C(O)R$^h$], SR$^g$, halogen, CN, and NO$_2$;

C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^g$, OC(O)—R$^g$, C(O)—OR$^g$, C(O)—R$^g$, NR$^g$R$^h$, NR$^g$—C(O)R$^h$, C(O)—NR$^g$R$^h$, N[C(O)R$^g$][C(O)R$^h$], SR$^g$, halogen, CN, and NO$_2$;

wherein

R$^g$ and R$^h$ are independently selected from the group consisting of H, C$_{1-10}$-alkyl, C$_{2-10}$-alkenyl and C$_{2-10}$-alkynyl, wherein C$_{1-10}$-alkenyl and C$_{2-10}$-alkynyl can be substituted with one to five substituents selected from the group consisting of halogen, CN and NO$_2$, n is 0, 1, 2 or 3, m is 0, 1, 2 or 3, and L$^1$ and are L$^2$ are independently from each other and at each occurrence selected from the group consisting of C$_{6-18}$-arylene, 5 to 20 membered heteroarylene,

wherein

C$_{6-18}$-arylene and 5 to 20 membered heteroarylene can be substituted with one to six substituents R$^3$ at each occurrence selected from the group consisting of C$_{1-30}$-alkyl, C$_{2-30}$-alkenyl, C$_{2-30}$-alkynyl, C$_{5-12}$-cycloalkyl, C$_{6-18}$-aryl and 5 to 20 membered heteroaryl, OR$^{31}$, OC(O)—R$^{31}$, C(O)—OR$^{31}$, C(O)—R$^{31}$, NR$^{31}$R$^{32}$, NR$^{31}$—C(O)R$^{32}$, C(O)NR$^{31}$R$^{32}$, N[C(O)R$^{31}$][C(O)R$^{32}$], SR$^{31}$, halogen, CN, SiR$^{Siv}$R$^{Siw}$R$^{Six}$ and OH, and wherein

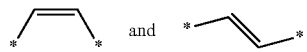

can be substituted with one or two substituents R$^4$ at each occurrence selected from the group consisting of C$_{1-30}$-alkyl, C$_{2-30}$-alkenyl, C$_{2-30}$-alkynyl, C$_{5-12}$-cycloalkyl, C$_{6-18}$-aryl and 5 to 20 membered heteroaryl, C(O)—R$^{41}$, C(O)—NR$^{41}$R$^{42}$, C(O)—OR$^{41}$ and CN, wherein R$^{31}$, R$^{32}$, R$^{41}$ and R$^{42}$ are independently from each other and at each occurrence selected from the group consisting of H, C$_{1-30}$-alkyl, C$_{2-30}$-alkenyl, C$_{2-30}$-alkynyl, C$_{5-12}$-cycloalkyl, C$_{6-18}$-aryl and 5 to 20 membered heteroaryl, and wherein C$_{1-30}$-alkyl, C$_{2-30}$-alkenyl and C$_{2-30}$-alkynyl can be substituted with one to ten substituents independently selected from the group consisting of C$_{5-8}$-cycloalkyl, C$_{6-14}$-aryl, 5 to 14 membered heteroaryl, OR$^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and at least two CH$_2$-groups, but not adjacent CH$_2$-groups of C$_{1-30}$-alkyl, C$_{2-30}$-alkenyl and C$_{2-30}$-alkynyl can be replaced by O or S, C$_{5-12}$-cycloalkyl can be substituted with one to six substituents independently selected from the group consisting of C$_{1-20}$-alkyl, C$_{2-20}$-alkenyl and C$_{2-20}$-alkynyl, C$_{5-8}$-cycloalkyl, C$_{6-14}$-aryl, 5 to 14 membered heteroaryl, OR$^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and one or two CH$_2$-groups, but not adjacent CH$_2$-groups, of C$_{5-12}$-cycloalkyl can be replaced by O, S, OC(O), CO, NR$^i$ or NR$^i$—CO, C$_{6-18}$-aryl and 5 to 20 membered heteroaryl can be substituted with one to six substituents independently selected from the group consisting of C$_{1-20}$-alkyl, C$_{2-20}$-alkenyl, C$_{2-20}$-alkynyl, C$_{5-8}$-cycloalkyl, C$_{6-14}$-aryl, 5 to 14 membered heteroaryl, OR$^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$, wherein R$^{Siv}$, R$^{Siw}$, R$^{Six}$ are independently from each other selected from the group consisting of H, C$_{2-20}$-alkenyl, C$_{02-20}$-alkynyl, C$_{5-6}$-cycloalkyl, phenyl and O—Si(CH$_3$)$_3$, R$^i$ and R$^j$ are independently selected from the group consisting of H, C$_{1-20}$-alkyl, C$_{1-20}$-alkenyl, C$_{2-20}$-alkynyl, C$_{5-8}$-cycloalkyl, C$_{6-14}$-aryl, and 5 to 14 membered heteroaryl, wherein C$_{1-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^k$, OC(O)—R$^l$, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO$_2$;

C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^k$, OC(O)—R$^1$, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO$_2$;

C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^k$, OC(O)—R$^k$, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO$_2$; wherein R$^k$ and R$^l$ are independently selected from the group consisting of H, C$_{1-10}$-alkyl, C$_{2-10}$-alkenyl and C$_{2-10}$-alkynyl, wherein C$_{1-10}$-alkyl, C$_{2-10}$-alkenyl and C$_{2-10}$-alkynyl can be substituted with one to five substituents selected from the group consisting of halogen, CN and NO$_2$.

Halogen can be F, Cl, Br and I.

C$_{1-4}$-alkyl, C$_{1-10}$-alkyl, C$_{1-20}$-alkyl, C$_{1-30}$-alkyl, C$_{1-36}$-alkyl, C$_{1-50}$-alkyl, C$_{1-60}$-alkyl and C$_{1-100}$-alkyl can be branched or unbranched. Examples of C$_{1-4}$-alkyl are methyl, ethyl, n-propyl, isopropyl, n-butyl, sec-butyl, isobutyl and tert-butyl. Examples of C$_{1-10}$-alkyl are C$_{1-4}$-alkyl, n-pentyl, neopentyl, isopentyl, n-(1-ethyl)propyl, n-hexyl, n-heptyl, n-octyl, n-(2-ethyl)hexyl, n-nonyl and n-decyl. Examples of C$_{1-20}$-alkyl are C$_{1-10}$-alkyl and n-undecyl, n-dodecyl, n-undecyl, n-dodecyl, n-tridecyl, n-tetradecyl, n-pentadecyl, n-hexadecyl, n-heptadecyl, n-octadecyl, n-nonadecyl and n-icosyl (C$_{20}$). Examples of C$_{1-30}$-alkyl, C$_{1-36}$-alkyl, C$_{1-50}$-alkyl, C$_{1-60}$-alkyl and C$_{1-100}$-alkyl are C$_{1-20}$-alkyl and n-docosyl (C$_{22}$), n-tetracosyl (C$_{24}$), n-hexacosyl (C$_{26}$), n-octacosyl (C$_{28}$) and n-triacontyl (C$_{30}$).

C$_{2-10}$-alkenyl, C$_{2-20}$-alkenyl, C$_{2-30}$-alkenyl, C$_{2-60}$-alkenyl and C$_{2-100}$-alkenyl can be branched or unbranched. Examples of C$_{1-20}$-alkenyl are vinyl, propenyl, cis-2-butenyl, trans-2-butenyl, 3-butenyl, cis-2-pentenyl, trans-2-pentenyl, cis-3-pentenyl, trans-3-pentenyl, 4-pentenyl, 2-methyl-3-butenyl, hexenyl, heptenyl, octenyl, nonenyl and docenyl. Examples of C$_{2-20}$-alkenyl, C$_{2-60}$-alkenyl and C$_{2-100}$-alkenyl are C$_{2-10}$-alkenyl and linoleyl (C$_{18}$), linolenyl (C$_{18}$), oleyl (C$_{18}$), and arachidonyl (C$_{20}$). Examples of C$_{2-30}$-alkenyl are C$_{2-20}$-alkenyl and erucyl (C$_{22}$).

C$_{2-10}$-alkynyl, C$_{2-20}$-alkynyl, C$_{2-30}$-alkynyl, C$_{2-60}$-alkynyl and C$_{2-100}$-alkynyl can be branched or unbranched. Examples of C$_{2-10}$-alkynyl are ethynyl, 2-propynyl, 2-butynyl, 3-butynyl, pentynyl, hexynyl, heptynyl, octynyl, nonynyl and decynyl. Examples of C$_{2-20}$-alkynyl, C$_{2-30}$-alkenyl, C$_{2-60}$-alkynyl and C$_{2-100}$-alkynyl are undecynyl, dodecynyl, undecynyl, dodecynyl, tridecynyl, tetradecynyl, pentadecynyl, hexadecynyl, heptadecynyl, octadecynyl, nonadecynyl and icosynyl (C$_{20}$).

Examples of C$_{5-6}$-cycloalkyl are cyclopentyl and cyclohexyl. Examples of C$_{5-8}$-cycloalkyl are C$_{5-6}$-cycloalkyl and cycloheptyl and cyclooctyl. C$_{5-12}$-cycloalkyl are C$_{5-8}$-cycloalkyl and cyclononyl, cyclodecyl, cycloundecyl and cyclododecyl.

Examples of C$_{6-10}$-aryl are phenyl,

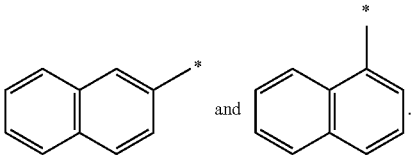

Examples of C$_{6-14}$-aryl are C$_{6-10}$-aryl and

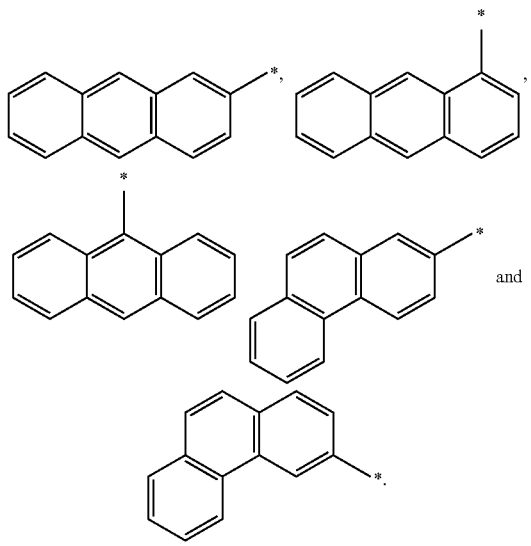

Examples of C$_{6-18}$-aryl are C$_{6-14}$-aryl and

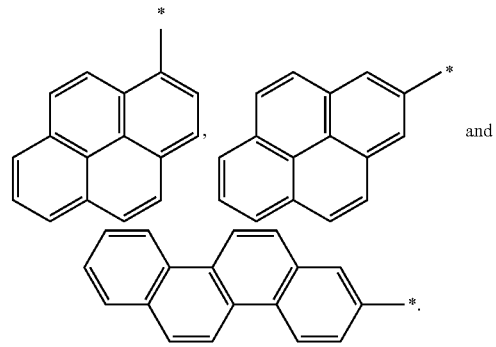

5 to 10 membered heteroaryl are 5 to 10 membered monocyclic or polycyclic, such as dicyclic, tricyclic or tetracyclic, ring systems, which comprise at least one heteroaromatic ring, and which may also comprise non-aromatic rings, which may be substituted by =O.

5 to 14 membered heteroaryl are 5 to 14 membered monocyclic or polycyclic, such as dicyclic, tricyclic or tetracyclic, ring systems, which comprise at least one heteroaromatic ring, and which may also comprise non-aromatic rings, which may be substituted by =O.

5 to 20 membered heteroaryl are 5 to 20 membered monocyclic or polycyclic, such as dicyclic, tricyclic or tetracyclic, ring systems, which comprise at least one heteroaromatic ring, and which may also comprise non-aromatic rings, which may be substituted by =O.

Examples of 5 to 10 membered heteroaryl are
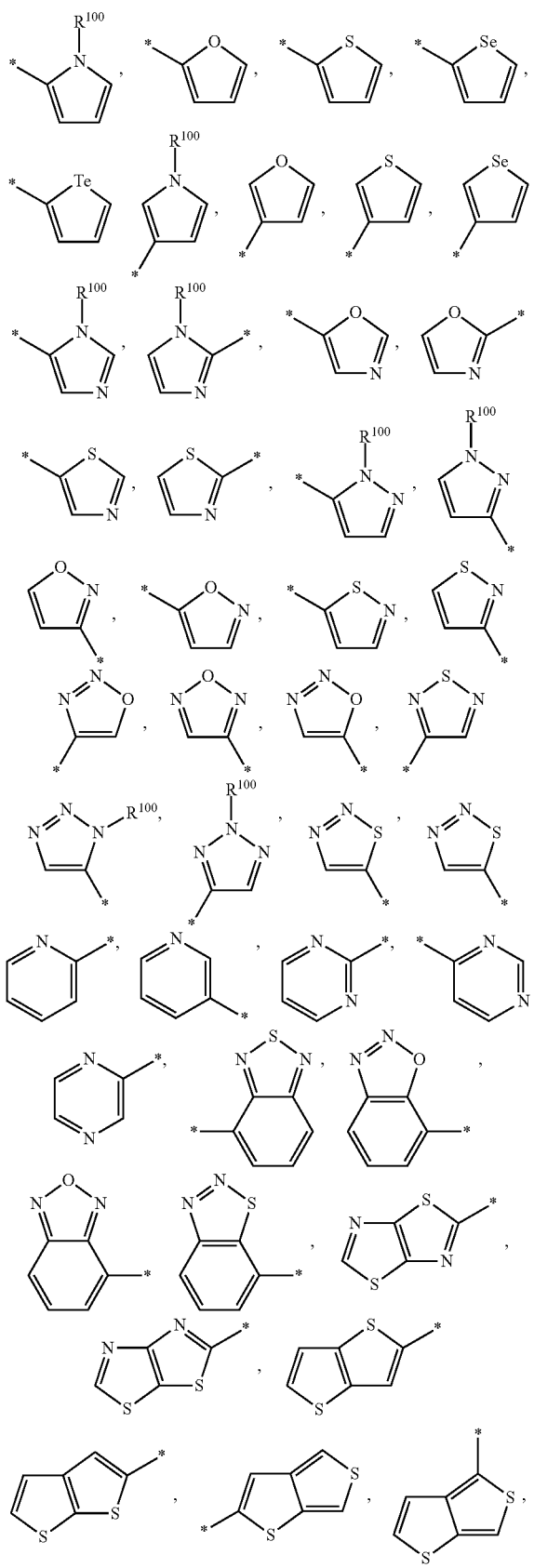
Examples of 5 to 14 membered heteroaryl are the examples given for the 5 to 10 membered heteroaryl and
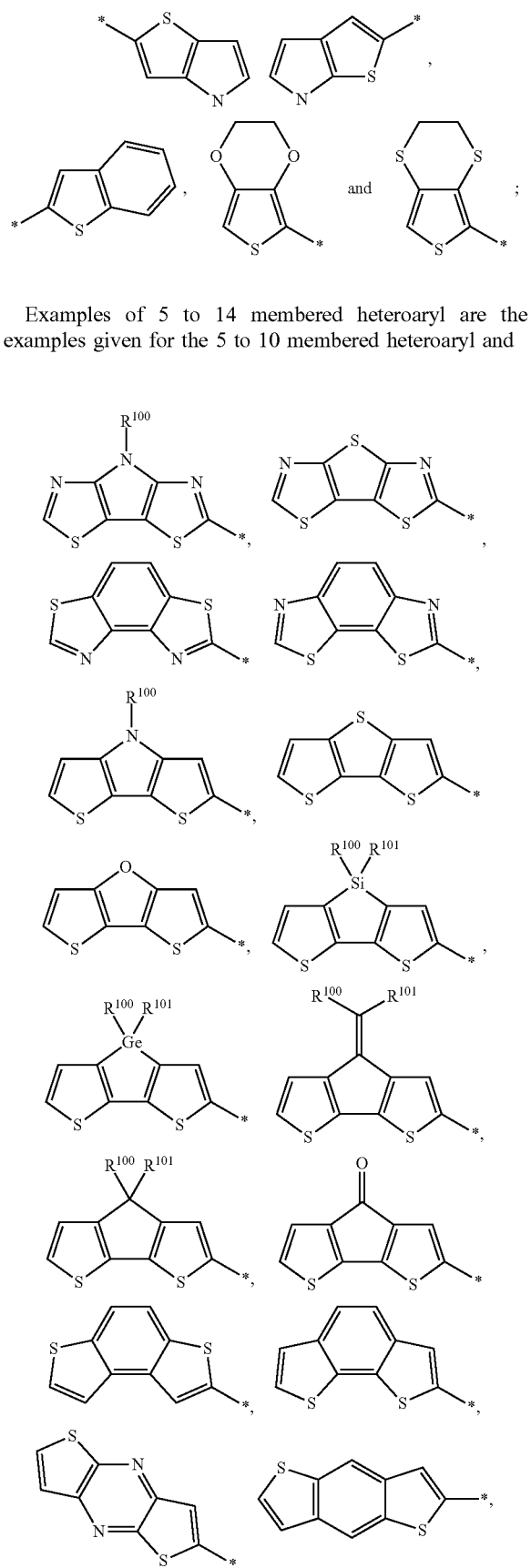

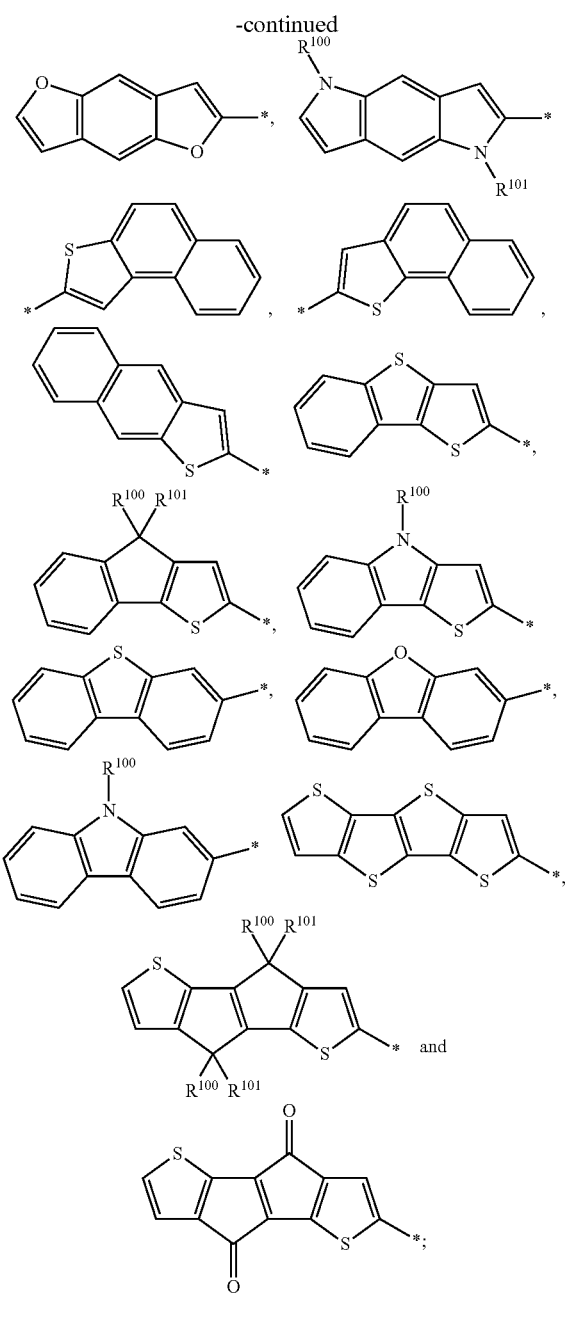
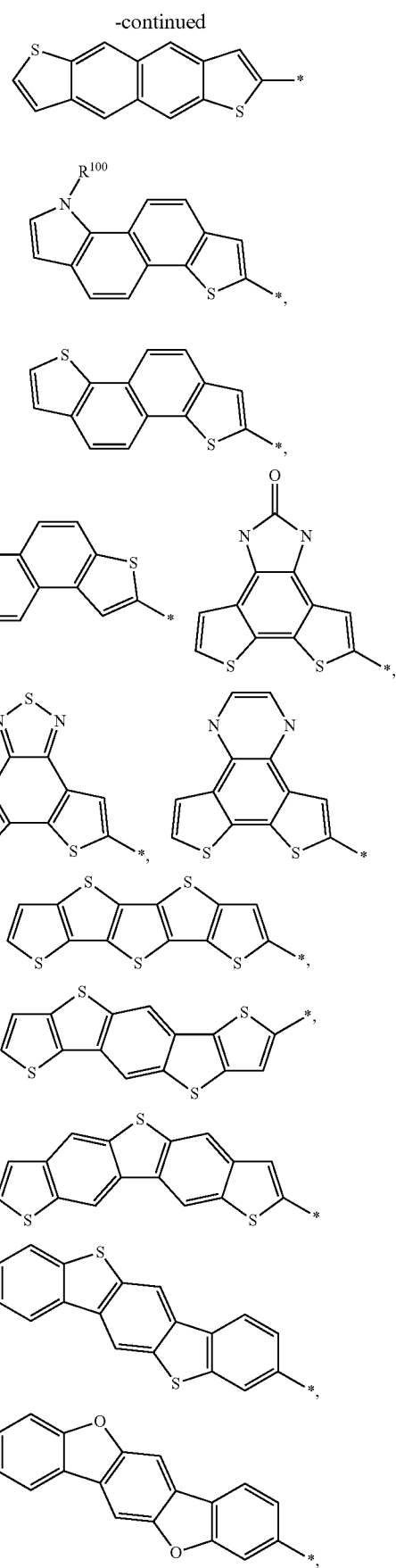
Examples of 5 to 20 membered heteroaryl are the examples given for the 5 to 14 membered heteroaryl and

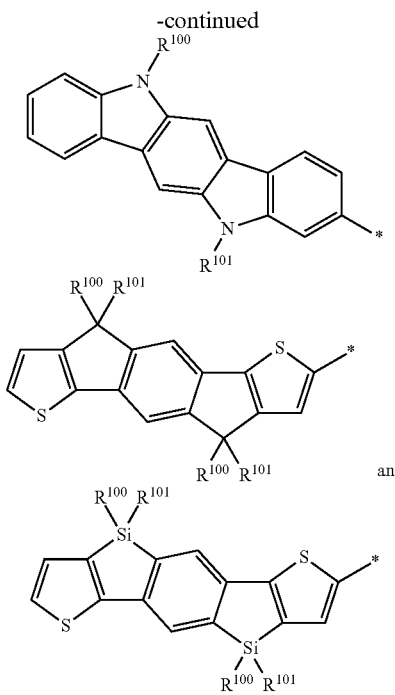

wherein
R[100] and R[101] are independently and at each occurrence selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, or R[100] and R[101], if attached to the same atom, together with the atom, to which they are attached, form a 5 to 12 membered ring system,
wherein
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^q$, $OC(O)$—$R^q$, $C(O)$—$OR^q$, $C(O)$—$R^q$, $NR^qR^r$, $NR^q$—$C(O)R^r$, $C(O)$—$NR^qR^r$, $N[C(O)R^q][C(O)R^r]$, $SR^q$, halogen, CN, and $NO_2$;
$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^q$, $OC(O)$—$R^q$, $C(O)$—$OR^q$, $C(O)$—$R^q$, $NR^qR^r$, $NR^q$—$C(O)R^r$, $C(O)$—$NR^qR^r$, $N[C(O)R^q][C(O)R^r]$, $SR^q$, halogen, CN, and $NO_2$;
$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^q$, $OC(O)$—$R^q$, $C(O)$—$OR^q$, $C(O)$—$R^q$, $NR^qR^r$, $NR^q$—$C(O)R^r$, $C(O)$—$NR^qR^r$, $N[C(O)R^q][C(O)R^r]$, $SR^q$, halogen, CN, and $NO_2$;
5 to 12 membered ring system can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^q$, $OC(O)$—$R^q$, $C(O)$—$OR^q$, $C(O)$—$R^q$, $NR^qR^r$, $NR^q$—$C(O)R^r$, $C(O)$—$NR^qR^r$, $N[C(O)R^q][C(O)R^r]$, $SR^q$, halogen, CN, and $NO_2$;
wherein
$R^q$ and $R^r$ are independently selected from the group consisting of H, $C_{1-10}$-alkyl, $C_{2-10}$-alkenyl and $C_{2-10}$-alkynyl, wherein
$C_{1-10}$-alkyl, $C_{2-10}$-alkenyl and $C_{2-10}$-alkynyl can be substituted with one to five substituents selected from the group consisting of halogen, CN and $NO_2$.

$C_{6-18}$-arylene is a 6 to 18 membered monocyclic or polycyclic, such as dicyclic, tricyclic or tetracyclic, ring system, which comprises at least one C-aromatic ring, and which may also comprise non-aromatic rings, which may be substituted by =O.

Examples of $C_{6-18}$-arylene are

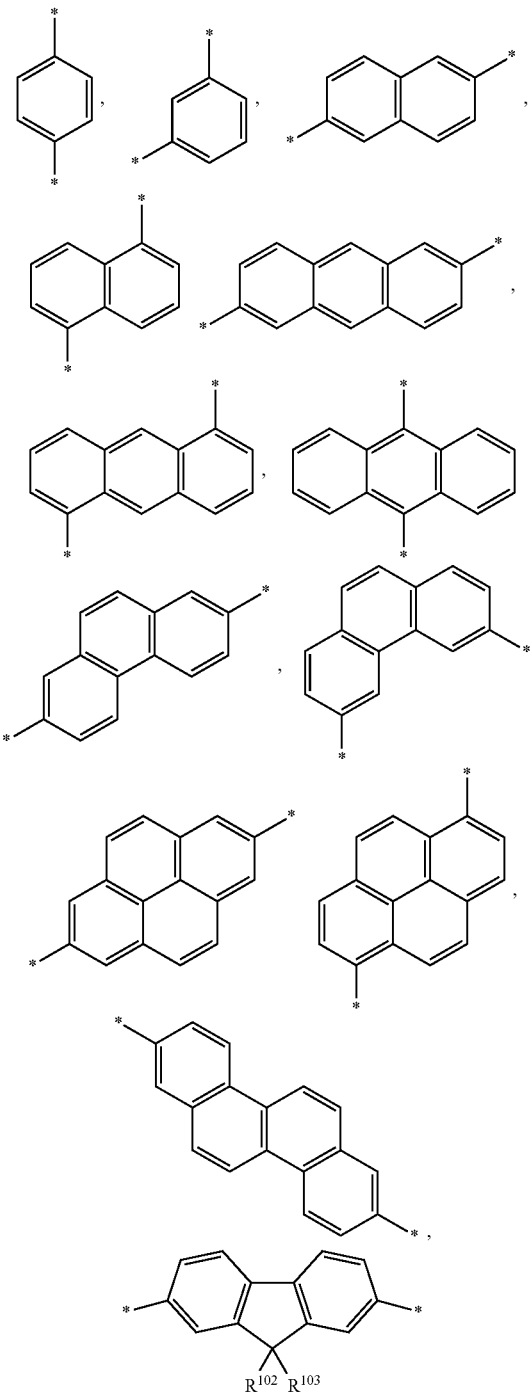

-continued

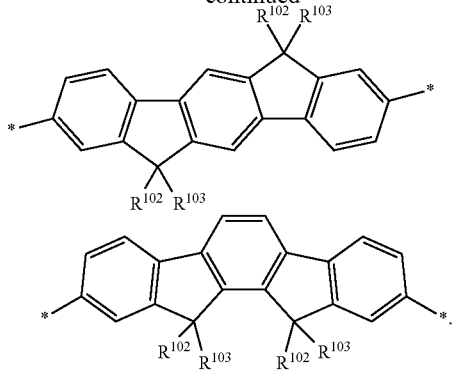

and wherein
R$^{102}$ and R$^{103}$ are independently and at each occurrence selected from the group consisting of H, C$_{1-20}$-alkyl, C$_{2-20}$-alkenyl, C$_{2-20}$-alkynyl, C$_{5-8}$-cycloalkyl, C$_{6-14}$-aryl, and 5 to 14 membered heteroaryl, or R$^{102}$ and R$^{103}$, if attached to the same atom, together with the atom, to which they are attached, form a 5 to 12 membered ring system,
wherein
C$_{1-20}$-alkyl, C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^s$, C(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;
C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;
C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;
5 to 12 membered ring system can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;
wherein
R$^s$ and R$^t$ are independently selected from the group consisting of H, C$_{1-10}$-alkyl, C$_{2-10}$-alkenyl and C$_{2-10}$-alkynyl,
wherein
C$_{1-10}$-alkyl, C$_{2-10}$-alkenyl and C$_{2-10}$-alkynyl can be substituted with one to five substituents selected from the group consisting of halogen, CN and NO$_2$.
5 to 20 membered heteroarylene is a 5 to 20 membered monocyclic or polycyclic, such as dicyclic, tricyclic or tetracyclic, ring system, which comprises at least one heteroaromatic ring, and which may also comprise non-aromatic rings, which may be substituted by =O.

Examples of 5 to 20 membered heteroarylene are

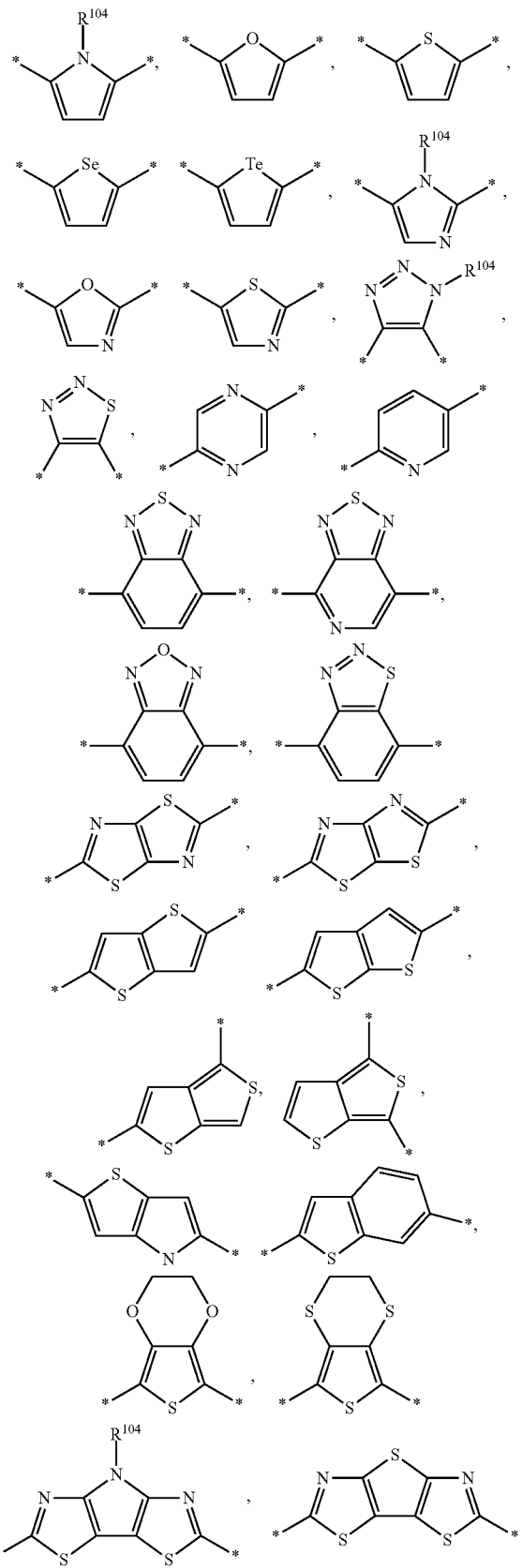

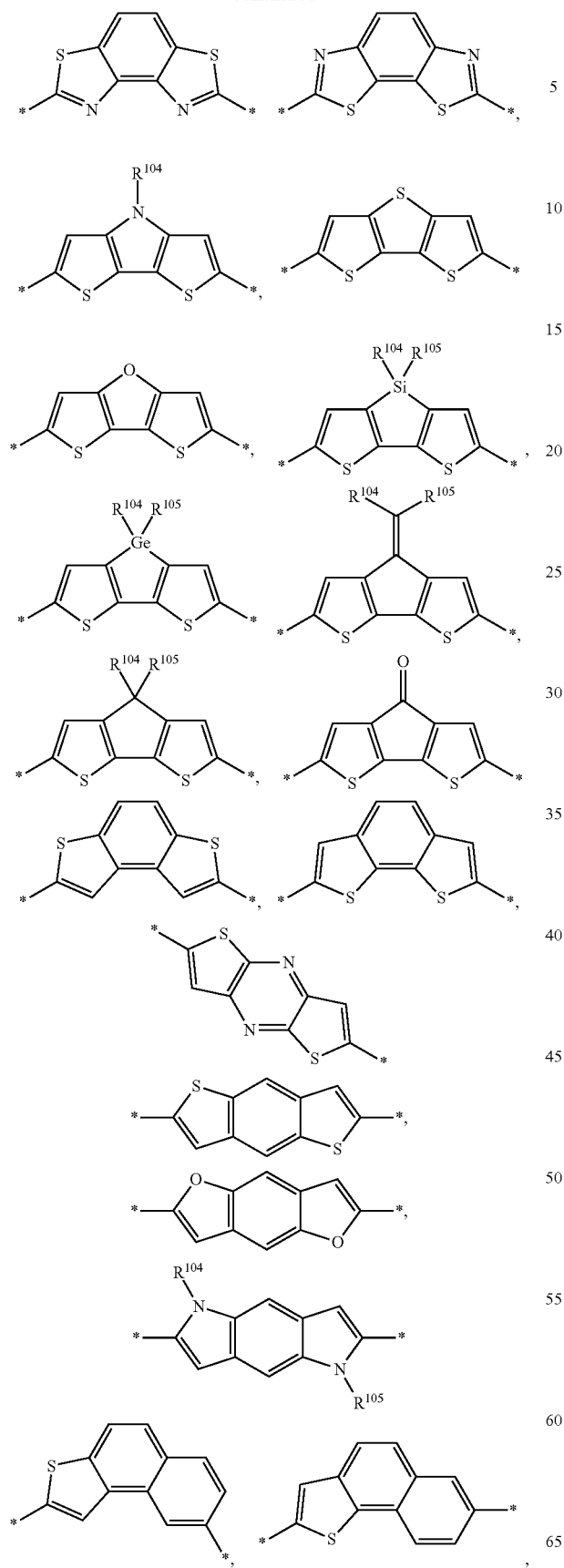
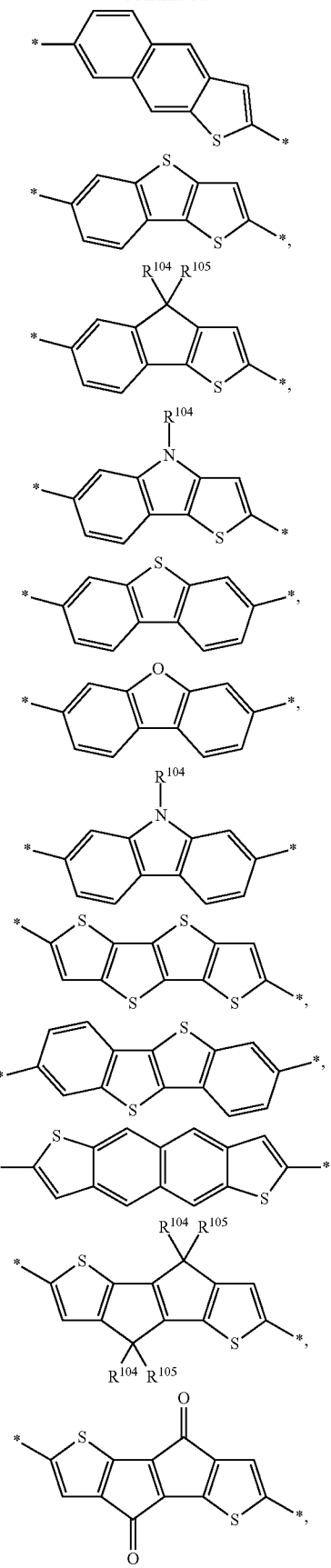

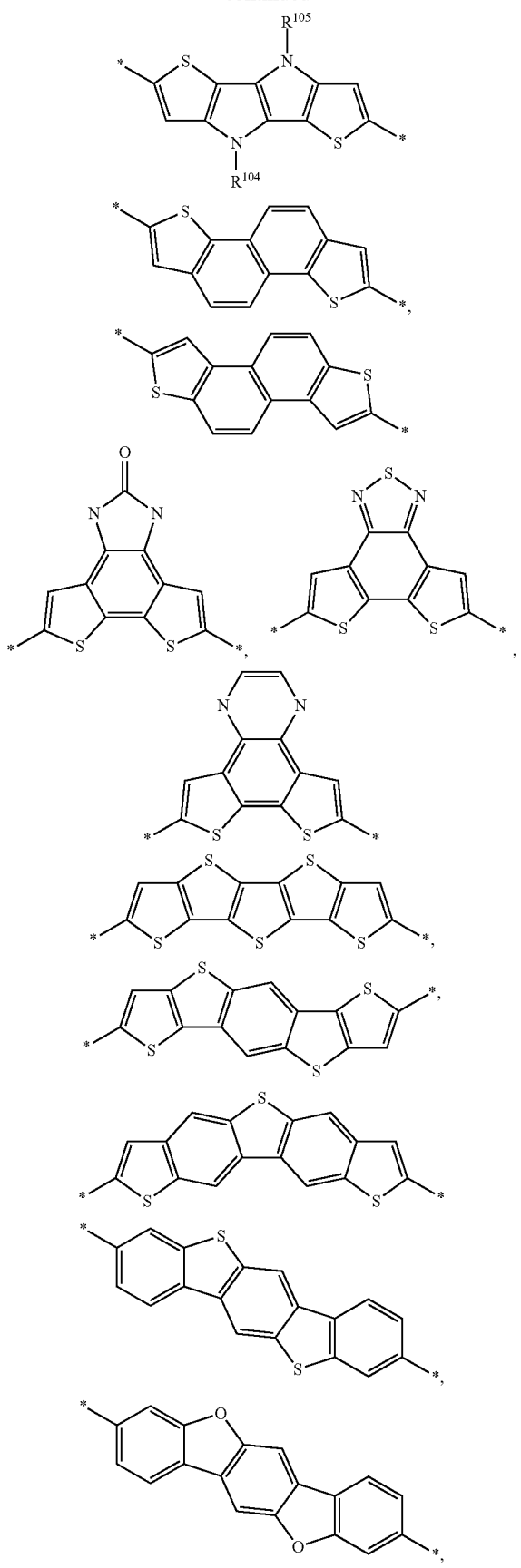

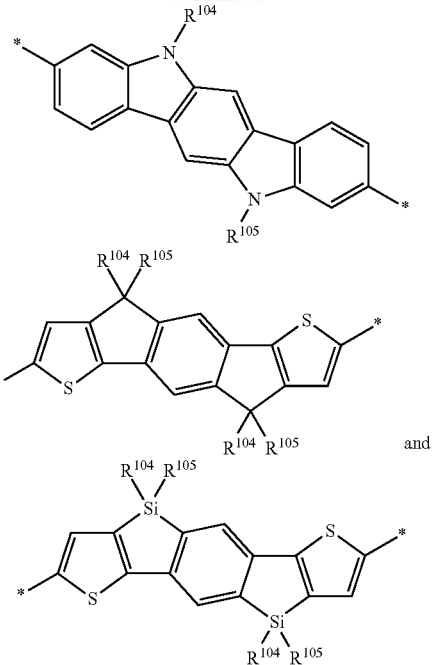

wherein
$R^{104}$ and $R^{105}$ are independently and at each occurrence selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, or $R^{104}$ and $R^{105}$, if attached to the same atom, together with the atom, to which they are attached, form a 5 to 12 membered ring system, wherein
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^s$, $OC(O)$—$R^t$, $C(O)$—$OR^s$, $C(O)$—$R^s$, $NR^sR^t$, $NR^s$—$C(O)R^t$, $C(O)$—$NR^sR^t$, $N[C(O)R^s][C(O)R^t]$, $SR^s$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^s$, $OC(O)$—$R^t$, $C(O)$—$OR^s$, $C(O)$—$R^s$, $NR^sR^t$, $NR^s$—$C(O)R^t$, $C(O)$—$NR^sR^t$, $N[C(O)R^s][C(O)R^t]$, $SR^s$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^s$, $OC(O)$—$R^t$, $C(O)$—$OR^s$, $C(O)$—$R^s$, $NR^sR^t$, $NR^s$—$C(O)R^t$, $C(O)$—$NR^sR^t$, $N[C(O)R^s][C(O)R^t]$, $SR^s$, halogen, CN, and $NO_2$;

5 to 12 membered ring system can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^s$, $OC(O)$—$R^t$, $C(O)$—$OR^s$, $C(O)$—$R^s$, $NR^sR^t$, $NR^s$—$C(O)R^t$, $C(O)$—$NR^sR^t$, $N[C(O)R^s][C(O)R^t]$, $SR^s$, halogen, CN, and $NO_2$;

wherein
$R^s$ and $R^t$ are independently selected from the group consisting of H, $C_{1-10}$-alkyl, $C_{2-10}$-alkenyl and $C_{2-10}$-alkynyl, wherein
$C_{1-10}$-alkyl, $C_{2-10}$-alkenyl and $C_{2-10}$-alkynyl can be substituted with one to five substituents selected from the group consisting of halogen, CN and $NO_2$.

The 5 to 12 membered ring system can contain, in addition to the atom, to which $R^{100}$ and $R^{101}$, respectively $R^{102}$ and $R^{103}$, respectively $R^{104}$ and $R^{105}$, are attached, ring members selected from the group consisting of $CH_2$, O, S and $NR^u$ werein $R^u$ is at each occurrence selected from the group consisting of H, $C_{1-10}$-alkyl, $C_{2-10}$-alkenyl and $C_{2-10}$-alkynyl.

Preferably, the polymers of the present invention comprise at least 60% by weight of units of formula (I) based on the weight of the polymer.

More preferably, the polymers of the present invention comprise at least 80% by weight of units of formula (I) based on the weight of the polymer.

Most preferably, the polymers of the present invention essentially consist of units of formula (I).

Preferably, $R^1$ is at each occurrence selected from the group consisting of H, $C_{1-100}$-alkyl, $C_{2-100}$-alkenyl, $C_{2-100}$-alkynyl, $C_{5-12}$-cycloalkyl, $C_{6-18}$-aryl, and a 5 to 20 membered heteroaryl,
wherein
$C_{1-100}$-alkyl, $C_{2-100}$-alkenyl and $C_{2-100}$-alkynyl can be substituted with one to fourty substituents independently selected from the group consisting of $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—C(O)$R^b$, $C(O)$—$NR^aR^b$, $SR^a$, $Si(R^{Sia})(R^{Sib})(R^{Sic})$, —O—$Si(R^{Sia})(R^{Sib})(R^{Sic})$, halogen and CN; and at least two $CH_2$-groups, but not adjacent $CH_2$-groups, of $C_{1-100}$-alkyl, $C_{2-100}$-alkenyl and $C_{2-100}$-alkynyl can be replaced by O or S,
$C_{5-12}$-cycloalkyl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—C(O)$R^b$, $C(O)$—$NR^aR^b$, $SR^a$, $Si(R^{Sia})(R^{Sib})(R^{Sic})$, —O—$Si(R^{Sia})(R^{Sib})(R^{Sic})$, halogen, and CN; and one or two $CH_2$-groups, but not adjacent $CH_2$-groups, of $C_{5-12}$-cycloalkyl can be replaced by O, S, OC(O), CO, $NR^a$ or $NR^a$—CO,
$C_{6-18}$-aryl and 5 to 20 membered heteroaryl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—C(O)$R^b$, $C(O)$—$NR^aR^b$, $SR^a$, $Si(R^{Sia})(R^{Sib})(R^{Sic})$, —O—$Si(R^{Sia})(R^{Sib})$, halogen, and CN,
wherein
$R^a$ and $R^b$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl and 5 to 14 membered heteroaryl,
$R^{Sia}$, $R^{Sib}$ and $R^{Sic}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, O—$C_{1-60}$-alkyl, O—$C_{2-60}$-alkenyl, O—$C_{2-60}$-alkynyl, O—$C_{5-8}$-cycloalkyl, —[O—$SiR^{Sid}R^{Sie}]_o$—$R^{Sif}$, wherein
o is an integer from 1 to 50,
$R^{Sid}$, $R^{Sie}$ and $R^{Sif}$ are independently selected from the group consisting of H, $C_{1-60}$-alkyl, $C_{2-60}$-alkenyl, $C_{2-60}$-alkynyl, $C_{6-8}$-cycloalkyl, $C_{6-14}$-aryl, —[O—$SiR^{Sig}R^{Sih}]_p$—$R^{Sii}$,
wherein
p is an integer from 1 to 50,
$R^{Sig}$ $R^{Sih}$ and $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—$Si(CH_3)_3$,
$C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)$—$NR^cR^d$, $SR^c$, $Si(R^{Sij})(R^{Sik})(R^{Sil})$, —O—$Si(R^{Sij})(R^{Sik})$ ($R^{Sil}$)halogen, and CN; and at least two $CH_2$-groups, but not adjacent $CH_2$-groups, of $C_{1-60}$-alkyl, $C_{2-60}$-alkenyl and $C_{2-60}$-alkynyl can be replaced by O or S,
$C_{5-8}$-cycloalkyl can be substituted with one to five substituents selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)$—$NR^cR^d$, $SR^c$, $Si(R^{Sij})(R^{Sik})(R^{Sil})$, —O—$Si(R^{Sij})(R^{Sik})$ ($R^{Sil}$), halogen, and CN; and one or two $CH_2$-groups, but not adjacent $CH_2$-groups, of $C_{5-8}$-cycloalkyl can be replaced by O, S, OC(O), CO, $NR^c$ or $NR^c$—CO,
$C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)$—$NR^cR^d$, $SR^c$, $Si(R^{Sij})(R^{Sik})(R^{Sil})$, —O—$Si(R^{Sij})(R^{Sik})$ ($R^{Sil}$), halogen and CN;
wherein
$R^c$ and $R^d$ are independently selected from the group consisting of H, $C_{1-30}$-alkyl, $C_{2-30}$-alkenyl and $C_{2-30}$-alkynyl,
$R^{Sij}$, $R^{Sik}$ and $R^{Sil}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—$SiR^{Sim}R^{Sin}]_q$—$R^{Sio}$,
wherein
q is an integer from 1 to 50,
$R^{Sim}R^{Sin}$, $R^{Sio}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, —[O—$SiR^{Sip}R^{Siq}]_r$—$R^{Sir}$, $NR^{70}R^{80}$, halogen, and O—C(O)—$R^{70}$;
wherein
r is an integer from 1 to 50,
$R^{Sip}$, $R^{Siq}$ $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, O—$Si(CH_3)_3$, $NR^{70}R^{800}$, halogen and O—C—(O)—$R^{700}$, $R^{70}$, $R^{80}$, $R^{700}$ and $R^{800}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen and CN.

More preferably, $R^1$ is at each occurrence selected from the group consisting of $C_{1-100}$-alkyl, $C_{2-100}$-alkenyl and $C_{2-100}$-alkynyl, wherein $C_{1-100}$-alkyl, $C_{2-100}$-alkenyl and $C_{2-100}$-alkynyl can be substituted with one to fourty substituents independently selected from the group consisting of $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—$C(O)R^b$, $C(O)$—$NR^aR^b$, $SR^a$, $Si(R^{Sia})(R^{Sib})(R^{Sic})$, —$O$—$Si(R^{Sia})(R^{Sib})(R^{Sic})$, halogen, and CN; and at least two CH$_2$-groups, but not adjacent CH$_2$-groups, of $C_{1-100}$-alkyl, $C_{2-100}$-alkenyl and $C_{2-100}$-alkynyl can be re-placed by O or S, wherein $R^a$ and $R^b$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl and 5 to 14 membered heteroaryl, $R^{Sia}$, $R^{Sib}$ and $R^{Sic}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, —[O—SiR$^{Sid}$R$^{Sie}$]$_o$—R$^{Sif}$, wherein o is an integer from 1 to 50, $R^{Sid}$, $R^{Sie}$ and $R^{Sif}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, —[O—SiR$^{Sig}$R$^{Sih}$]$_p$—R$^{Sii}$, wherein p is an integer from 1 to 50, $R^{Sig}$ $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—Si(CH$_3$)$_3$, $C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)$—$NR^cR^d$, $SR^c$, $Si(R^{Sij})(R^{Sik})(R^{Sil})$, —$O$—$Si(R^{Sij})(R^{Sik})(R^{Sil})$, halogen, and CN; and at least two CH$_2$-groups, but not adjacent CH$_2$-groups, of $C_{1-60}$-alkyl, $C_{2-60}$-alkenyl and $C_{2-60}$-alkynyl can be replaced by O or S, $C_{5-8}$-cycloalkyl can be substituted with one to five substituents selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)$—$NR^cR^d$, $SR^c$, $Si(R^{Sij})(R^{Sik})(R^{Sil})$, —$O$—$Si(R^{Sij})(R^{Sik})(R^{Sil})$, halogen, and CN; and one or two CH$_2$-groups, but not adjacent CH$_2$-groups, of $C_{5-8}$-cycloalkyl can be replaced by O, S, OC(O), CO, NR$^c$ or NR$^c$—CO, $C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)$—$NR^cR^d$, $SR^c$, $Si(R^{Sij})(R^{Sik})(R^{Sil})$—$O$—$Si(R^{Sij})(R^{Sik})(R^{Sil})$ halogen, and CN;

wherein $R^c$ and $R^d$ are independently selected from the group consisting of H, $C_{1-30}$-alkyl, $C_{2-30}$-alkenyl and $C_{2-30}$-alkynyl, $R^{Sij}$, $R^{Sik}$ and $R^{Sil}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—SiR$^{Sim}$R$^{Sin}$]$_q$—R$^{Sio}$, wherein q is an integer from 1 to 50, $R^{Sim}$, $R^{Sin}$, $R^{Sio}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—SiR$^{Sip}$R$^{Siq}$]$_r$—R$^{Sir}$, wherein r is an integer from 1 to 50, $R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—Si(CH$_3$)$_3$, $C_{1-30}$-alkyl, $C_{2-30}$-alkenyl and $C_{2-30}$-alkynyl can be substituted with one to ten substituents selected from the group consisting of halogen and CN.

Even more preferably, $R^1$ is at each occurrence selected from the group consisting of $C_{1-50}$-alkyl, $C_{2-50}$-alkenyl and $C_{2-50}$-alkynyl, wherein $C_{1-50}$-alkyl, $C_{2-50}$-alkenyl and $C_{2-50}$-alkynyl can be substituted with one to twenty substituents independently selected from the group consisting of $C_{5-6}$-cycloalkyl, $C_{6-10}$-aryl, 5 to 10 membered heteroaryl, $OR^a$, $SR^a$, $Si(R^{Sia})(R^{Sib})(R^{Sic})$, —$O$—$Si(R^{Sia})(R^{Sib})(R^{Sic})$, halogen, and CN; and at least two CH$_2$-groups, but not adjacent CH$_2$-groups, of $C_{1-50}$alkyl, $C_{2-50}$-alkenyl and $C_{2-50}$-alkynyl can be replaced by O or S, wherein $R^a$ is independently selected from the group consisting of H, $C_{1-30}$-alkyl, $C_{2-30}$-alkenyl, $C_{2-30}$-alkynyl, $C_{5-6}$-cycloalkyl and $C_{6-10}$-aryl, $R^{Sia}$, $R^{Sib}$ and $R^{Sic}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—SiR$^{Sid}$R$^{Sie}$]$_o$—R$^{Sif}$, wherein o is an integer from 1 to 50, $R^{Sid}$, $R^{Sie}$, $R^{Sif}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—SiR$^{Sig}$R$^{Sih}$]$_p$—R$^{Sii}$, wherein p is an integer from 1 to 50, $R^{Sig}$ $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—Si(CH$_3$)$_3$, $C_{1-30}$-alkyl, $C_{2-30}$-alkenyl and $C_{2-30}$-alkynyl can be substituted with one to ten substituents selected from the group consisting of halogen and CN.

Most preferably, $R^1$ is at each occurrence selected from the group consisting of $C_{1-36}$-alkyl, $C_{2-36}$-alkenyl and $C_{2-36}$-alkynyl, wherein
$C_{1-36}$-alkyl, $C_{2-36}$-alkenyl and $C_{2-36}$-alkynyl can be substituted with one to twenty substituents independently selected from the group consisting of $C_{5-6}$-cycloalkyl, $C_{6-10}$-aryl, 5 to 10 membered heteroaryl, $OR^a$, $SR^a$, $Si(R^{Sia})(R^{Sib})(R^{Sic})$, $-O-Si(R^{Sia})(R^{Sib})(R^{Sic})$, halogen, and CN; and at least two $CH_2$-groups, but not adjacent $CH_2$-groups, of $C_{1-36}$-alkyl, $C_{2-36}$-alkenyl and $C_{2-36}$-alkynyl can be replaced by O or S,
wherein
$R^a$ is independently selected from the group consisting of H, $C_{1-20}$-alkyl, $C_{2-20}$-alkenyl, $C_{2-20}$-alkynyl, $C_{5-6}$-cycloalkyl and $C_{6-10}$-aryl
$R^{Sia}$, $R^{Sib}$ and $R^{Sic}$ are independently selected from the group consisting of H, $C_{1-20}$-alkyl, $C_{2-20}$-alkenyl, $C_{2-20}$-alkynyl, $C_{5-6}$-cycloalkyl, $C_{6-10}$-aryl, $-[O-Si R^{Sid}R^{Sie}]_o-R^{Sif}$
wherein
o is an integer from 1 to 50,
$R^{Sid}$, $R^{Sie}$, $R^{Sif}$ are independently selected from the group consisting of H, $C_{1-30}$-alkyl, $C_{2-20}$-alkenyl, $C_{2-20}$-alkynyl, $C_{5-6}$-cycloalkyl, $C_{6-10}$-aryl, $-[O-SiR^{Sig}R^{Sih}]_p R^{Sii}$,
wherein
p is an integer from 1 to 50,
$R^{Sig}$ $R^{Sih}$, $R^{Sii}$ are independently selected from the group consisting of H, $C_{1-30}$-alkyl, $C_{2-20}$-alkenyl, $C_{2-20}$-alkynyl, $C_{5-6}$-cycloalkyl, $C_{6-10}$-aryl, $O-Si(CH_3)_3$,
$C_{1-20}$-alkyl, $C_{2-20}$-alkenyl and $C_{2-20}$-alkynyl can be substituted with one to ten substituents selected from the group consisting of halogen and CN.

In particular, $R^1$ is at each occurrence unsubstituted $C_{1-36}$-alkyl.

Preferably, $R^2$ is at each occurrence selected from the group consisting of hydrogen, $C_{1-30}$-alkyl and halogen,
wherein
$C_{1-30}$-alkyl can be substituted with one to ten substituents independently selected from the group consisting of $C_{5-8}$-cycloalkyl, $C_{6-14}$-aryl, 5 to 14 membered heteroaryl, $OR^e$, $OC(O)-R^e$, $C(O)-OR^e$, $C(O)-R^e$, $NR^eR^f$, $NR^e-C(O)R^f$, $C(O)-NR^eR^f$, $N[C(O)R^e][C(O)R^f]$, $SR^e$, halogen, CN, $SiR^{Sis}R^{Sit}R^{Siu}$ and $NO_2$; and at least two $CH_2$-groups, but not adjacent $CH_2$-groups, of $C_{1-30}$-alkyl can be replaced by O or S,
wherein
$R^{Sis}$, $R^{Sit}$ and $R^{Siu}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and $O-Si(CH_3)_3$,
$R^e$ and $R^f$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl,
wherein
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^g$, $OC(O)-R^g$, $C(O)-OR^g$, $C(O)-R^g$, $NR^gR^h$, $NR^g-C(O)R^h$, $C(O)-NR^gR^h$, $N[C(O)R^g][C(O)R^h]$, $SR^g$, halogen, CN, and $NO_2$;
$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)-R^g$, $C(O)-OR^g$, $C(O)-R^g$, $NR^gR^h$, $NR^g-C(O)R^h$, $C(O)-NR^gR^h$, $N[C(O)R^g][C(O)R^h]$, $SR^g$, halogen, CN, and $NO_2$;
$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)-R^g$, $C(O)-OR^g$, $C(O)-R^g$, $NR^gR^h$, $NR^g-C(O)R^h$, $C(O)-NR^gR^h$, $N[C(O)R^g][C(O)R^h]$, $SR^g$, halogen, CN, and $NO_2$;
wherein
$R^g$ and $R^h$ are independently selected from the group consisting of H, $C_{1-10}$-alkyl, $C_{2-10}$-alkenyl and $C_{2-10}$-alkynyl,
wherein
$C_{1-10}$-alkyl, $C_{2-10}$-alkenyl and $C_{2-10}$-alkynyl can be substituted with one to five substituents selected from the group consisting of halogen, CN and $NO_2$.

More preferably, $R^2$ is at each occurrence selected from the group consisting of hydrogen, unsubstituted $C_{1-30}$-alkyl and halogen.

In particular, $R^2$ is in each occurrence hydrogen.

Preferably, n is 0, 1 or 2. More preferably, n is 0 or 1. Most preferably, n is 0.

Preferably, m is 0, 1 or 2.

Preferably, $L^1$ and $L^2$ are independently from each other and at each occurrence selected from the group consisting of $C_{6-18}$-arylene, 5 to 20 membered heteroarylene,
and

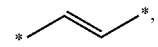

wherein
$C_{6-18}$-arylene and 5 to 20 membered heteroarylene can be substituted with one to six substituents $R^3$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $OR^{31}$, $OC(O)-R^{31}$, $C-OR^{31}$, $C(O)-R^{31}$, $NR^{31}R^{32}$, $NR^{31}-C(O)R^{32}$, $C(O)-NR^{31}R^{32}SR^{31}$, halogen, CN, $SiR^{Siv}R^{Siw}R^{Six}$ and OH, and
wherein

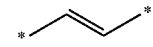

can be substituted with one or two substituents $R^4$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $C(O)-R^{41}$, $C(O)-NR^{41}R^{42}$, $C(O)-OR^{41}$ and CN,
wherein
$R^{31}$, $R^{32}$, $R^{41}$ and $R^{42}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and
wherein
$C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and at least two CH$_2$-groups, but not adjacent CH$_2$-groups of C$_{1-30}$-alkyl, C$_{2-30}$-alkenyl and C$_{2-30}$-alkynyl can be replaced by O or S, C$_{5-12}$-cycloalkyl can be substituted with one to six substituents independently selected from the group consisting of C$_{1-20}$-alkyl, C$_{2-20}$-alkenyl and C$_{2-20}$-alkynyl, C$_{5-8}$-cycloalkyl, C$_{6-14}$-aryl, 5 to 14 membered heteroaryl, OR$^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and one or two CH$_2$-groups, but not adjacent CH$_2$-groups, of C$_{5-12}$-cycloalkyl can be replaced by O, S, OC(O), CO, NR$^i$ or NR$^i$—CO, C$_{6-18}$-aryl and 5 to 20 membered heteroaryl can be substituted with one to six substituents independently selected from the group consisting of C$_{1-20}$-alkyl, C$_{2-20}$-alkenyl, C$_{2-20}$-alkynyl, C$_{5-8}$-cycloalkyl, C$_{6-14}$-aryl, 5 to 14 membered heteroaryl, OR$^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$, wherein R$^{Siv}$, R$^{Siw}$, R$^{Six}$ are independently from each other selected from the group consisting of H, C$_{2-20}$-alkenyl, C$_{2-20}$-alkynyl, C$_{5-6}$-cycloalkyl, phenyl and O—Si(CH$_3$)$_3$, R$^i$ and R$^j$ are independently selected from the group consisting of H, C$_{1-20}$-alkyl, C$_{2-20}$-alkenyl, C$_{2-20}$-alkynyl, C$_{5-8}$-cycloalkyl, C$_{6-14}$-aryl, and 5 to 14 membered heteroaryl, wherein C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^k$, OC(O)—R$^l$, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO$_2$;

C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^k$, OC(O)—R$^l$, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO$_2$;

C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^k$, OC(O)—R$^l$, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO$_2$;

wherein

R$^k$ and R$^l$ are independently selected from the group consisting of H, C$_{1-10}$-alkyl, C$_{2-10}$-alkenyl and C$_{2-10}$-alkynyl, wherein C$_{1-10}$-alkyl, C$_{2-10}$-alkenyl and C$_{2-10}$-alkynyl can be substituted with one to five substituents selected from the group consisting of halogen, CN and NO$_2$.

More preferably, L$^1$ and L$^2$ are independently from each other and at each occurrence selected from the group consisting of 5 to 20 membered heteroarylene, and

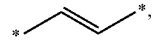

wherein 5 to 20 membered heteroarylene can be substituted with one to six substituents R$^3$ at each occurrence selected from the group consisting of C$_{1-30}$-alkyl, C$_{2-30}$-alkenyl, C$_{2-30}$-alkynyl, C$_{5-20}$-cycloalkyl, C$_{6-18}$-aryl and 5 to 20 membered heteroaryl, OR$^{31}$, OC(O)—R$^{31}$, C(O)—OR$^{31}$, C(O)—R$^{31}$, NR$^{31}$R$^{32}$, NR$^{31}$—C(O)R$^{32}$, C(O)—NR$^{31}$R$^{32}$, SR$^{31}$, halogen, CN, SiR$^{Siv}$R$^{Siw}$R$^{Six}$ and OH, and wherein

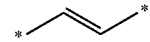

can be substituted with one or two substituents R$^4$ at each occurrence selected from the group consisting of C$_{1-30}$-alkyl, C$_{2-30}$-alkenyl, C$_{2-30}$-alkynyl, C$_{5-12}$-cycloalkyl, C$_{6-18}$-aryl and 5 to 20 membered heteroaryl, C(O)—R$^{41}$, C(O)—NR$^{41}$R$^{42}$, C(O)—OR$^{41}$ and CN, wherein R$^{31}$, R$^{32}$, R$^{41}$ and R$^{42}$ are independently from each other and at each occurrence selected from the group consisting of H, C$_{1-30}$-alkyl, C$_{2-30}$-alkenyl, C$_{2-30}$-alkynyl, C$_{5-12}$-cycloalkyl, C$_{6-18}$-aryl and 5 to 20 membered heteroaryl, and wherein C$_{2-30}$-alkenyl and C$_{2-30}$-alkynyl can be substituted with one to ten substituents independently selected from the group consisting of C$_{5-8}$-cycloalkyl, C$_{6-14}$-aryl, 5 to 14 membered heteroaryl, OR$^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and at least two CH$_2$-groups, but not adjacent CH$_2$-groups of C$_{1-30}$-alkyl, C$_{2-30}$-alkenyl and C$_{2-30}$-alkynyl can be replaced by O or S, C$_{5-12}$-cycloalkyl can be substituted with one to six substituents independently selected from the group consisting of C$_{1-20}$-alkyl, C$_{2-20}$-alkenyl and C$_{2-20}$-alkynyl, C$_{5-8}$-cycloalkyl, C$_{6-14}$-aryl, 5 to 14 membered heteroaryl, OR$^i$, OC(O)—R$^i$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and one or two CH$_2$-groups, but not adjacent CH$_2$-groups, of C$_{5-12}$-cycloalkyl can be replaced by O, S, OC(O), CO, NR$^i$ or NR$^i$—CO, C$_{6-18}$-aryl and 5 to 20 membered heteroaryl can be substituted with one to six substituents independently selected from the group consisting of C$_{1-20}$-alkyl, C$_{2-20}$-alkenyl, C$_{2-20}$-alkynyl, C$_{5-8}$-cycloalkyl, C$_{6-14}$-aryl, 5 to 14 membered heteroaryl, OR$^i$, OC(O)—R$^j$, C(O)—OR$^i$, C(O)—R$^i$, NR$^i$R$^j$, NR$^i$C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$, wherein $R^{Siv}$, $R^{Siw}$, $R^{Six}$ are independently from each other selected from the group consisting of H, $C_{2-20}$-alkenyl, $C_{2-20}$-alkynyl, $C_{5-6}$-cycloalkyl, phenyl and O—Si(CH$_3$)$_3$, $R^i$, and $R^j$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, wherein $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, N[C(O)R$^k$][C(O)R$^l$], $SR^k$, halogen, CN, and NO$_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, N[C(O)R$^k$][C(O)R$^l$], $SR^k$, halogen, CN, and NO$_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, N[C(O)R$^k$][C(O)R$^l$], $SR^k$, halogen, CN, and NO$_2$;

wherein $R^k$ and $R^l$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and NO$_2$.

Even more preferably, $L^1$ and $L^2$ are independently from each other and at each occurrence selected from the group consisting of 5 to 20 membered heteroarylene, and

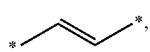

wherein 5 to 20 membered heteroarylene is selected from the group consisting of

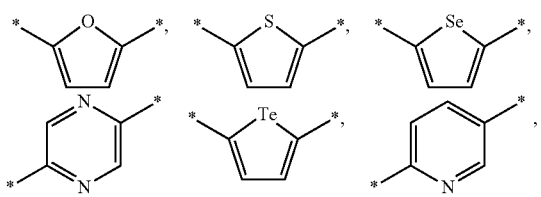

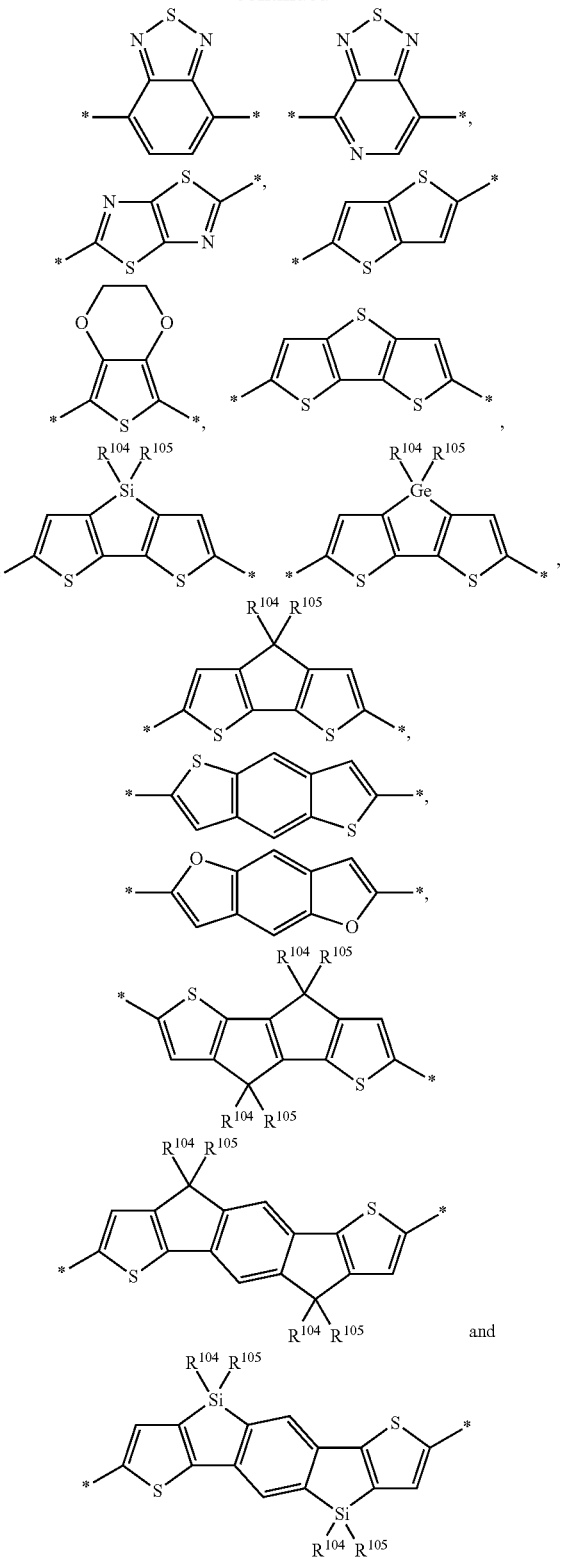

wherein $R^{104}$ and $R^{105}$ are independently and at each occurrence selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, or $R^{104}$ and R$^{105}$, if attached to the same atom, together with the atom, to which they are attached, form a 5 to 12 membered ring system,
wherein
C$_{1-20}$-alkyl, C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;
C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;
C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;
5 to 12 membered ring system can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;
wherein
R$^s$ and R$^t$ are independently selected from the group consisting of H, C$_{1-10}$-alkyl, C$_{2-10}$-alkenyl and C$_{2-10}$-alkynyl,
wherein
C$_{1-10}$-alkyl, C$_{2-10}$-alkenyl and C$_{2-10}$-alkynyl can be substituted with one to five substituents selected from the group consisting of halogen, CN and NO$_2$,
wherein
5 to 20 membered heteroarylene can be substituted with one to six substituents R$^3$ at each occurrence selected from the group consisting of C$_{1-30}$-alkyl and halogen, and
wherein

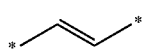

can be substituted with one or two substituents R$^4$ at each occurrence selected from the group consisting of C$_{1-30}$-alkyl, C(O)—R$^{41}$, C(O)—OR$^{41}$ and CN,
wherein
R$^{41}$ is at each occurrence C$_{1-30}$-alkyl.
Most preferably, L$^1$ and L$^2$ are independently from each other and at each occurrence 5 to 20 membered heteroarylene,
wherein 5 to 20 membered heteroarylene is selected from the group consisting of

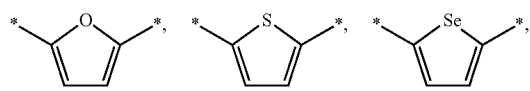

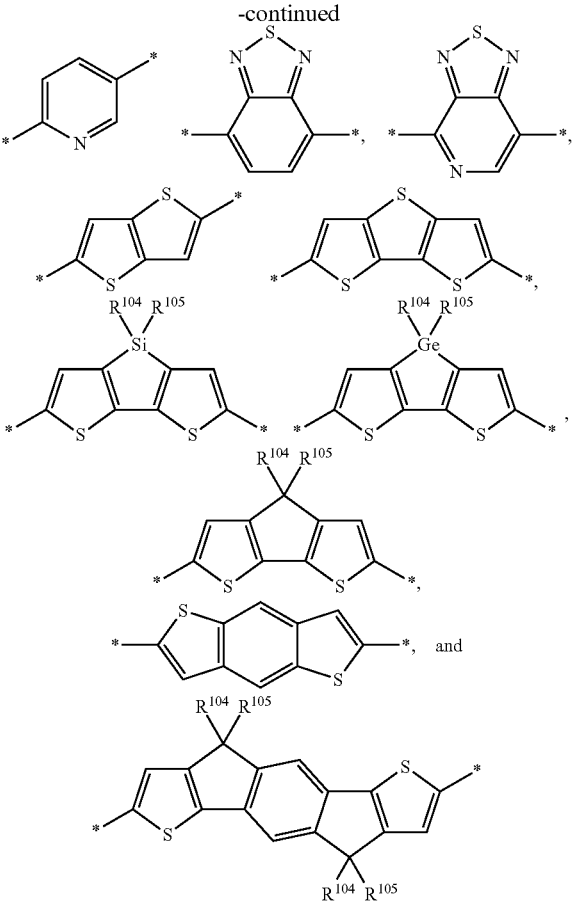

wherein
R$^{104}$ and R$^{105}$ are independently and at each occurrence selected from the group consisting of H and C$_{1-20}$-alkyl,
wherein
5 to 20 membered heteroarylene can be substituted with one to six substituents R$^3$ at each occurrence selected from the group consisting of C$_{1-30}$-alkyl and halogen.
In particular, L$^1$ and L$^2$ are independently from each other and at each occurrence 5 to 20 membered heteroarylene,
wherein 5 to 20 membered heteroarylene is selected from the group consisting of

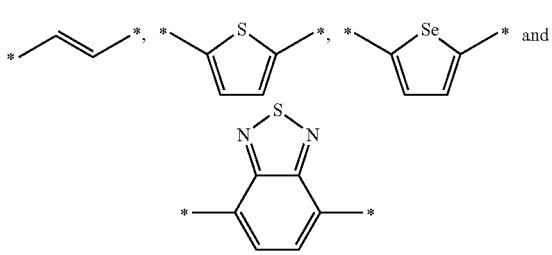

wherein
5 to 20 membered heteroarylene is unsubstituted.
In preferred polymers comprising at least one unit of formula (1)
wherein
n is 0, 1, 2 or 3,
m is 0, 1, 2 or 3, and $L^1$ and $L^2$ are independently from each other and at each occurrence selected from the group consisting of $C_{6-18}$-arylene, 5 to 20 membered heteroarylene, and

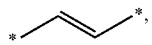

wherein
$C_{6-18}$-arylene and 5 to 20 membered heteroarylene can be substituted with one to six substituents $R^3$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $OR^{31}$, $OC(O)$—$R^{31}$, $C(O)$—$OR^{31}$, $C(O)$—$R^{31}$, $NR^{31}R^{32}$, $NR^{31}$—$C(O)R^{32}$, $C(O)$—$NR^{31}R^{32}$, $SR^{31}$, halogen, CN, $SiR^{Siv}R^{Siw}R^{Six}$ and OH, and
wherein

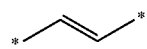

can be substituted with one or two substituents $R^4$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $C(O)$—$R^{41}$, $C(O)$—$NR^{41}R^{42}$, $C(O)$—$OR^{41}$ and CN,
wherein
$R^{31}$, $R^{32}$, $R^{41}$ and $R^{42}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and
wherein
$C_{1-30}$alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^i$, $OC(O)$—$R^i$, $C(O)$—$OR^i$, $C(O)$—$R^i$, $NR^iR^j$, $NR^i$—$C(O)R^j$, $C(O)$—$NR^iR^j$, $N[C(O)R^i][C(O)R^j]$, $SR^i$, halogen, CN, $SiR^{Siv}R^{Siw}R^{Six}$ and $NO_2$; and at least two $CH_2$-groups, but not adjacent $CH_2$-groups of $C_{1-30}$-alkyl, $C_{2-30}$-alkenyl and $C_{2-30}$-alkynyl can be replaced by O or S,
$C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, $OR^i$, $OC(O)$—$R^j$, $C(O)$—$OR^i$, $C(O)$—$R^i$, $NR^iR^j$, $NR^i$—$C(O)R^j$, $C(O)$—$NR^iR^j$, $N[C(O)R^i][C(O)R^j]$, $SR^i$, halogen, CN, $SiR^{Siv}R^{Siw}R^{Six}$ and $NO_2$; and one or two $CH_2$-groups, but not adjacent $CH_2$-groups, of $C_{5-12}$-cycloalkyl can be replaced by O, S, $OC(O)$, CO, $NR^i$ or $NR^i$—CO,
$C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^i$, $OC(O)$—$R^j$, $C(O)$—$OR^i$, $C(O)$—$R^i$, $NR^iR^j$, $NR^i$—$C(O)R^j$, $C(O)$—$NR^iR^j$, $N[C(O)R^i][C(O)R^j]$, $SR^i$, halogen, CN, $SiR^{Siv}R^{Siw}R^{Six}$ and $NO_2$, wherein
$R^{Siv}$, $R^{Siw}$, $R^{Six}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—$Si(CH_3)_3$,
$R^i$ and $R^j$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl,
wherein
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, $N[C(O)R^k][C(O)R^k]$, $SR^k$, halogen, CN, and $NO_2$;
$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;
$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;
wherein
$R^k$ and $R^l$ are independently selected from the group consisting of H, $C_{1-10}$-alkyl, $C_{2-10}$-alkenyl and $C_{2-10}$-alkynyl,
wherein
$C_{1-10}$alkyl, $C_{2-10}$-alkenyl and $C_{2-10}$-alkynyl can be substituted with one to five substituents selected from the group consisting of halogen, CN and $NO_2$.

$R^2$ is at each occurrence selected from the group consisting of hydrogen, unsubstituted $C_{1-30}$-alkyl and halogen,
$L^1$ and $L^2$ are independently from each other and at each occurrence selected from the group consisting of 5 to 20 membered heteroarylene, and

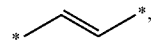

wherein
5 to 20 membered heteroarylene can be substituted with one to six substituents $R^3$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $OR^{31}$, $OC(O)$—$R^{31}$, $C(O)$—$OR^{31}$, $C(O)$—$R^{31}$, $NR^{31}R^{32}$, $NR^{31}$—$C(O)R^{32}$, $C(O)$—$NR^{31}R^{32}$, $SR^{31}$, halogen, CN, $SiR^{Siv}R^{Siw}R^{Six}$ and OH, and
wherein

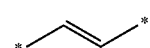

can be substituted with one or two substituents $R^4$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, C(O)—$R^{41}$, C(O)—$NR^{41}R^{42}$, C(O)—$OR^{41}$ and CN,
wherein
$R^{31}$, $R^{32}$, $R^{41}$ and $R^{42}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and
wherein
$C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^i$, OC(O)—$R^i$, C(O)—$OR^i$, C(O)—$R^i$, $NR^iR^j$, $NR^i$—C(O)$R^j$, C(O)—$NR^iR^j$, $N[C(O)R^i][C(O)R^j]$, $SR^i$, halogen, CN, $SiR^{Siv}R^{Siw}R^{Six}$ and $NO_2$; and at least two $CH_2$-groups, but not adjacent $CH_2$-groups of $C_{1-30}$-alkyl, $C_{2-30}$-alkenyl and $C_{2-30}$alkynyl can be replaced by O or S,
$C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, $OR^i$, OC(O)—$R^i$, C(O)—$OR^i$, C(O)—$R^i$, $NR^iR^j$, $NR^i$—C(O)$R^j$, C(O)—$NR^iR^j$, $N[C(O)R^i][C(O)R^j]$, $SR^i$, halogen, CN, $SiR^{Siv}R^{Siw}R^{Six}$ and $NO_2$; and one or two $CH_2$-groups, but not adjacent $CH_2$-groups, of $C_{5-12}$-cycloalkyl can be replaced by O, S, OC(O), CO, $NR^i$ or $NR^i$—CO, In even more preferred polymers comprising at least one unit of formula (1)
$R^1$ is at each occurrence selected from the group consisting of $C_{1-36}$-alkyl, $C_{2-36}$-alkenyl and $C_{2-36}$-alkynyl,
wherein
$C_{1-36}$-alkyl, $C_{2-36}$-alkenyl and $C_{2-36}$-alkynyl can be substituted with one to twenty substituents independently selected from the group consisting of $C_{5-6}$-cycloalkyl, $C_{6-10}$-aryl, 5 to 10 membered heteroaryl, $OR^a$, $SR^a$, $Si(R^{Sia})(R^{Sib})(R^{Sic})$, —O—$Si(R^{Sia})(R^{Sib})(R^{Sic})$, halogen, and CN; and at least two $CH_2$-groups, but not adjacent $CH_2$-groups, of $C_{1-36}$-alkyl, $C_{2-36}$-alkenyl and $C_{2-36}$-alkynyl can be replaced by O or S,
wherein
$R^a$ and $R^b$ are independently selected from the group consisting of H, $C_{1-20}$-alkyl, $C_{2-20}$-alkenyl, $C_{2-20}$-alkynyl, $C_{5-6}$-cycloalkyl and $C_{6-10}$-aryl
$R^{Sia}$, $R^{Sib}$ and $R^{Sic}$ are independently selected from the group consisting of H, $C_{1-20}$-alkyl, $C_{2-20}$-alkenyl, $C_{2-20}$-alkynyl, $C_{5-6}$-cycloalkyl, $C_{6-10}$-aryl, —[O—$SiR^{Sid}R^{Sie}]_o$—$R^{Sif}$
wherein
o is an integer from 1 to 50,
$R^{Sid}$, $R^{Sie}$, $R^{Sif}$ are independently selected from the group consisting of H, $C_{1-30}$-alkyl, $C_{2-20}$-alkenyl, $C_{2-20}$-alkynyl, $C_{5-6}$-cycloalkyl, $C_{6-10}$-aryl, —[O—$SiR^{Sig}R^{Sih}]_p$—$R^{Sii}$,
wherein
is an integer from 1 to 50,
$R^{Sig}$ $R^{Sih}$, $R^{Sii}$ are independently selected from the group consisting of H, $C_{1-30}$-alkyl, $C_{2-20}$-alkenyl, $C_{2-20}$-alkynyl, $C_{5-6}$-cycloalkyl, $C_{6-10}$-aryl, O—$Si(CH_3)_3$, $C_{1-20}$-alkyl, $C_{2-20}$-alkenyl and $C_{2-20}$-alkynyl can be substituted with one to ten substituents selected from the group consisting of halogen and CN,
$R^2$ is at each occurrence selected from the group consisting of unsubstituted hydrogen, $C^{1-30}$-alkyl and halogen,
n is 0 or 1,
m is 0, 1 or 2, and
$L^1$ and $L^2$ are independently from each other and at each occurrence selected from the group consisting of 5 to 20 membered heteroarylene,
and

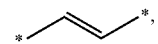

wherein 5 to 20 membered heteroarylene is selected from the group consisting of

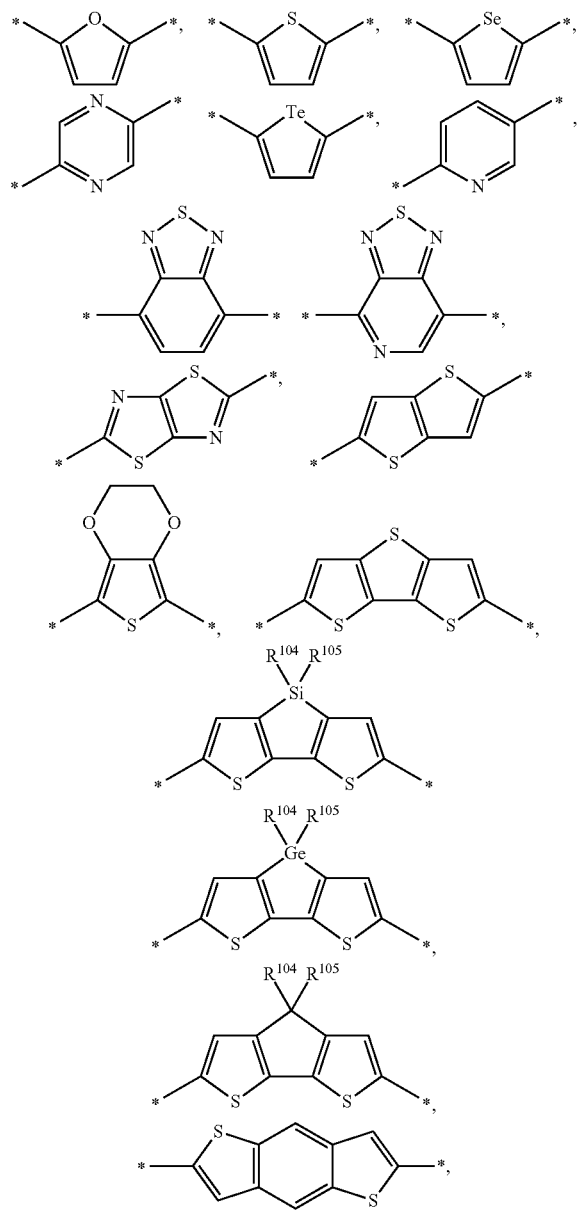

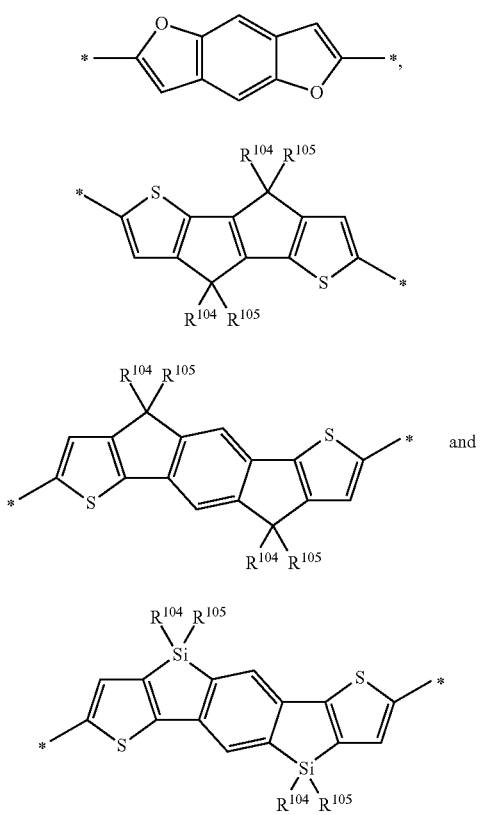

wherein
R$^{104}$ and R$^{105}$ are independently and at each occurrence selected from the group consisting of H, C$_{1-20}$-alkyl, C$_{2-20}$-alkenyl, C$_{2-20}$-alkynyl, C$_{5-8}$-cycloalkyl, C$_{6-14}$-aryl, and 5 to 14 membered heteroaryl, or R$^{104}$ and R$^{105}$, if attached to the same atom, together with the atom, to which they are attached, form a 5 to 12 membered ring system,
wherein
  C$_{1-20}$-alkyl, C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;
  C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;
  C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;
  5 to 12 membered ring system can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;
wherein
  R$^s$ and R$^t$ are independently selected from the group consisting of H, C$_{1-10}$-alkyl, C$_{2-10}$-alkenyl and C$_{2-10}$-alkynyl,
wherein
  C$_{1-10}$-alkyl, C$_{2-10}$-alkenyl and C$_{2-10}$-alkynyl can be substituted with one to five substituents selected from the group consisting of halogen, CN and NO$_2$,
wherein
5 to 20 membered heteroarylene can be substituted with one to six substituents R$^3$ at each occurrence selected from the group consisting of C$_{1-30}$-alkyl and halogen, and
wherein

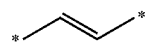

can be substituted with one or two substituents R$^4$ at each occurrence selected from the group consisting of C$_{1-30}$-alkyl, C(O)—R$^{41}$, C(O)—OR$^{41}$ and CN,
wherein
  R$^{41}$ is at each occurrence C$_{1-30}$-alkyl.
In most preferred polymers comprising at least one unit of formula (1)
  R$^1$ is at each occurrence unsubstituted C$_{1-36}$-alkyl,
  R$^2$ is hydrogen,
  n is 0,
  m is 0, 1 or 2, and
  L$^1$ and L$^2$ are independently from each other and at each occurrence 5 to 20 membered heteroarylene,
  wherein 5 to 20 membered heteroarylene is selected from the group consisting of

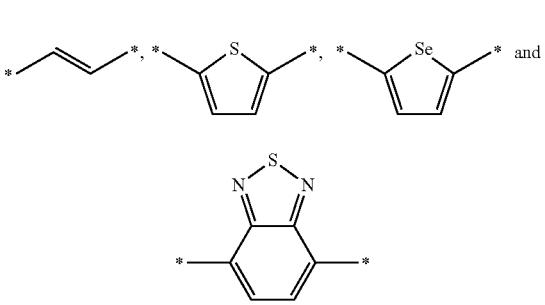

wherein
5 to 20 membered heteroarylene is unsubstituted.
Particular preferred polymers of the present invention comprise at least one unit of formula

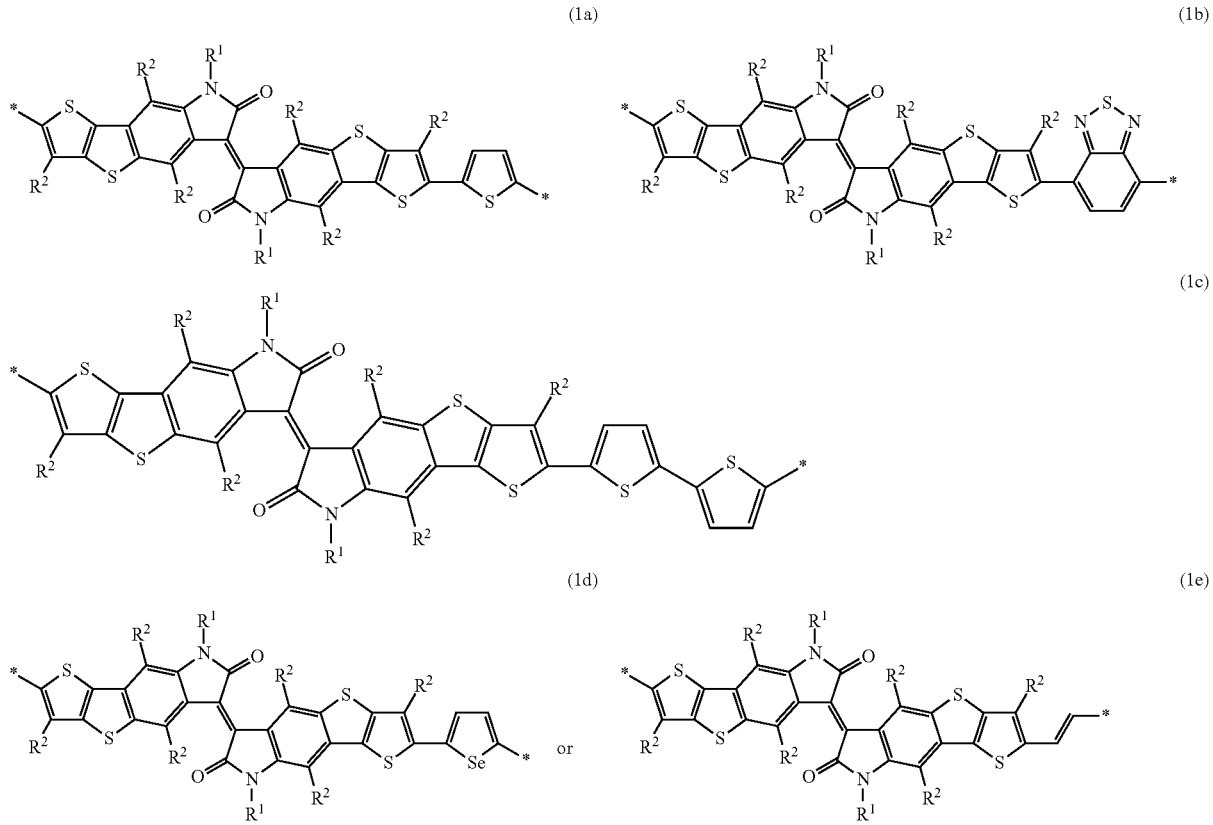

The polymers of the present invention have preferably a weight average molecular weight ($M_w$) of 1 to 10000 kDa and a number average molecular weight ($M_n$) of 1 to 10000 kDa. The polymers of the present invention have more preferably a weight average molecular weight ($M_w$) of 1 to 1000 kDa and a number average molecular weight ($M_n$) of 1 to 100 kDa. The polymers of the present invention have most preferably a weight average molecular weight ($M_w$) of 10 to 100 kDa and a number average molecular weight ($M_n$) of 5 to 60 kDa. The weight average molecular weight ($M_w$) and the number average molecular weight ($M_n$) can be determined by gel permeation chromatography (GPC) at 80° C. using chlorobenzene as eluent and a polystyrene as standard.

The polymers of the present invention can be prepared by methods known in the art.

For examples, polymers of the present invention comprising at least one unit of formula (1), wherein n is 0 and which are of formula (1-I)

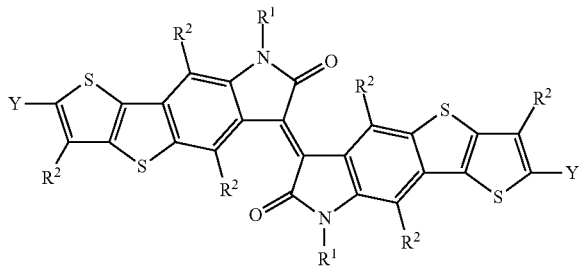

wherein
$R^1$, $R^2$ and $L^2$ are as defined above,
m is 0, 1, 2 or 3,
can be prepared by reacting a compound of formula (2)

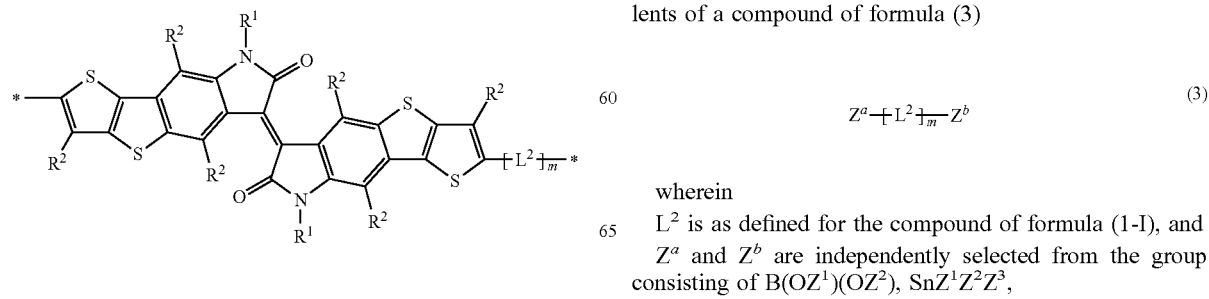

wherein Y is at each occurrence I, Br, Cl or O—S(O)$_2$CF$_3$, and $R^1$ and $R^2$ are as defined above, with one mol equivalents of a compound of formula (3)

$$Z^a\text{---}(L^2)_m\text{---}Z^b \qquad (3)$$

wherein
$L^2$ is as defined for the compound of formula (1-I), and
$Z^a$ and $Z^b$ are independently selected from the group consisting of B(OZ$^1$)(OZ$^2$), SnZ$^1$Z$^2$Z$^3$,

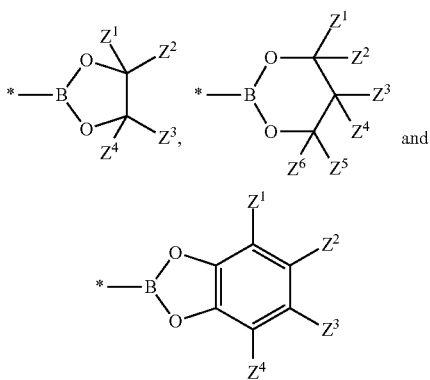

wherein $Z^1$, $Z^2$, $Z^3$, $Z^4$, $Z^5$ and $Z^6$ are independently from each other and at each occurrence H or $C_{1-4}$-alkyl.

For examples, polymers of the present invention comprising at least one unit of formula (1), wherein n and m are 0 and which are of formula (1-II)

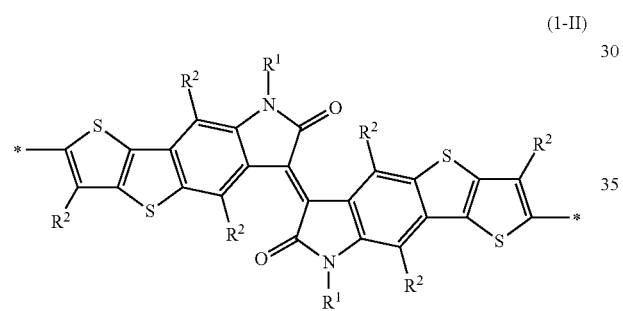
(1-II)

wherein
$R^1$ and $R^2$ are as defined above
can be prepared by reacting a compound of formula (2)

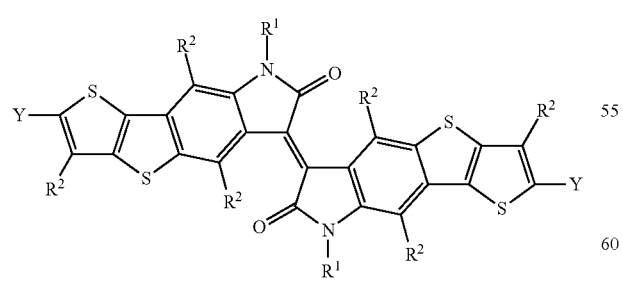
(2)

wherein Y is at each occurrence I, Br, Cl or $O-S(O)_2CF_3$, and $R^1$ and $R^2$ are as defined above, with a compound of formula (8)

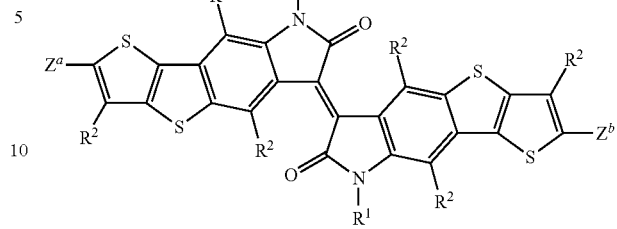
(8)

wherein
$R^1$ and $R^2$ are as defined for the compound of formula (1-II), and
$Z^a$ and $Z^b$ are independently selected from the group consisting of $B(OZ^1)(OZ^2)$, $SnZ^1Z^2Z^3$,

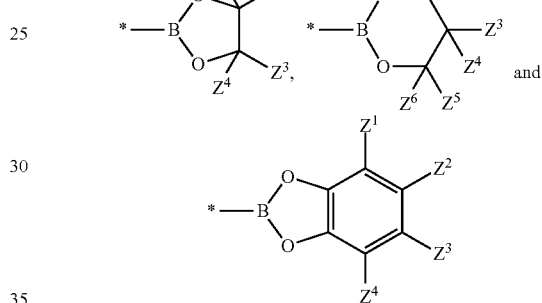

wherein $Z^1$, $Z^2$, $Z^3$, $Z^4$, $Z^5$ and $Z^6$ are independently from each other and at each occurence H or $C_{1-4}$-alkyl.

When $Z^a$ and $Z^b$ are independently selected from the group consisting of $B(OZ^1)(OZ^2)$,

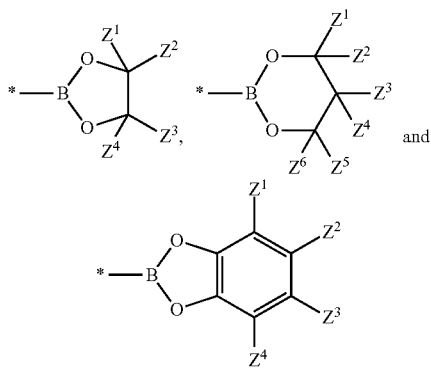

wherein $Z^1$, $Z^2$, $Z^3$, $Z^4$, $Z^5$ and $Z^6$ are independently from each other and at each occurrence H or $C_{1-4}$-alkyl, the reaction is usually performed in the presence of a catalyst, preferably a Pd catalyst such as $Pd(P(Ph)_3)_4$, $Pd(OAc)_2$ and $Pd_2(dba)_3$, and a base such as $K_3PO_4$, $Na_2CO_3$, $K_2CO_3$, LiOH and NaOMe. Depending on the Pd catalyst, the reaction may also require the presence of a phosphine ligand such as $P(Ph)_3$, $P(o$-tolyl$)_3$ and $P(tert$-Bu$)_3$.

The reaction is also usually performed at elevated temperatures, such as at temperatures in the range of 40 to 250° C., preferably 60 to 200° C. The reaction can be performed in the presence of a suitable solvent such as tetrahydrofuran, toluene or chlorobenzene. The reaction is usually performed under inert gas.

When $Z^a$ and $Z^b$ are independently $SnZ^1Z^2Z^3$, wherein $Z^1$, $Z^2$ and $Z^3$ are independently from each other $C_{1-4}$-alkyl, the reaction is usually performed in the presence of a catalyst, preferably a Pd catalyst such as $Pd(P(Ph)_3)_4$ and $Pd_2(dba)_3$. Depending on the Pd catalyst, the reaction may also require the presence of a phosphine ligand such as $P(Ph)_3$, $P(o\text{-tolyl})_3$ and $P(tert\text{-Bu})_3$. The reaction is also usually performed at elevated temperatures, such as at temperatures in the range of 40 to 250° C., preferably 60 to 200° C. The reaction can be performed in the presence of a suitable solvent such as toluene or chlorobenzene. The reaction is usually performed under inert gas.

The compound of formula (2) can be prepared by methods known in the art.

For examples, compounds of formula (2), wherein

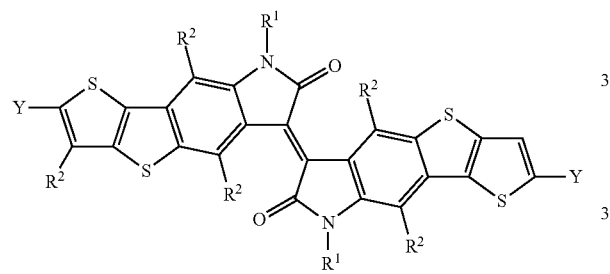

(2)

wherein Y is I, Br, Cl or O-triflate, and $R^1$ is at each occurrence unsubstituted $C_{1-36}$-alkyl, can be prepared by treating a compound of formula (2')

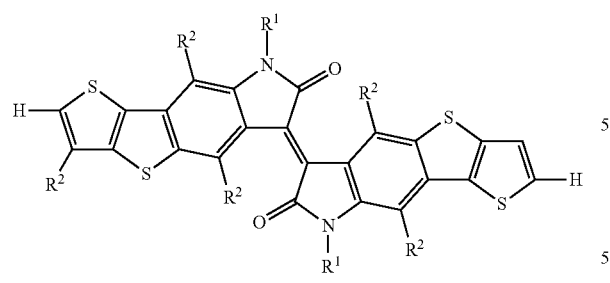

(2')

wherein $R^1$ is at each occurrence unsubstituted $C_{1-36}$-alkyl, with an Y-donor.

For example, when Y is Br, the Y-donor can be N-bromosuccinimide. When using N-bromosuccinimide as Y-donor, the reaction can be performed at 0° C. in the presence of $CHCl_3$/acetic acid as solvent.

A compound of formula (3), wherein $R^1$ is at each occurrence unsubstituted $C_{1-36}$-alkyl, can be prepared by treating a compound of formula (4)

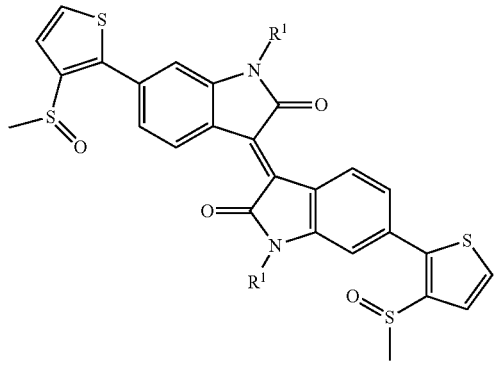

(4)

wherein $R^1$ is at each occurrence unsubstituted $C_{1-36}$-alkyl, with Eaton's reagent.

A compound of formula (4), wherein $R^1$ is at each occurrence unsubstituted $C_{1-36}$-alkyl, can be prepared by treating a compound of formula (5)

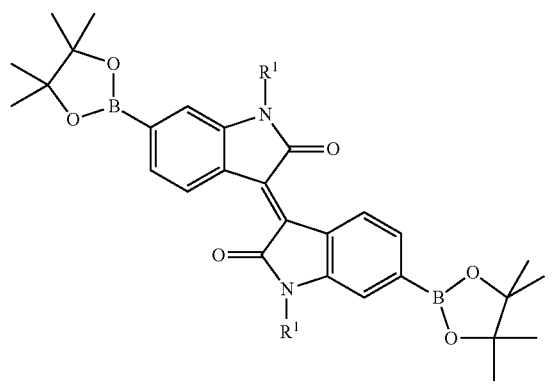

(5)

wherein $R^1$ is at each occurrence unsubstituted $C_{1-36}$-alkyl, with a compound of formula (6)

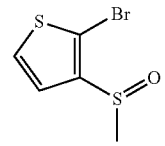

(6)

The reaction is usually performed in a suitable solvent such as toluene and at a suitable temperature such as in the range of 0 to 140° C.

The compound of formula (5), wherein $R^1$ is at each occurrence unsubstituted $C_{1-36}$-alkyl, can be prepared by treating a compound of formula (7)

(7)

[Structure: 6,6'-dibromo isoindigo with $R^1$ substituents on N]

with bis(pinacolato)diboron.

The reaction is usually performed in the presence of a catalyst, preferably a palladium catalyst. The reaction is usually performed in a suitable solvent, such as anhydrous toluene, at elevated temperatures such as in the range of 40 to 160° C.

6,6'-Dibromo isoindigo (7) and Bromo-3-methylsulfinyl-thiophene (6) can be synthesized according to the literature (Org. Lett. 2010, 12, 660-663; Adv. Mater. 2013, 25, 838-843.

Also part of the invention are intermediates of formulae (2)

[Structure of intermediate (2) with Y substituents]

and (2')

[Structure of intermediate (2') with H substituents]

wherein
$R^1$ and $R^2$ are as defined above,
Y is at each occurence I, Br, Cl or —O—S(O)$_2$CF$_3$.

In preferred intermediates of formulae (2) and (2')
$R^1$ is at each occurrence selected from the group consisting of C$_{1-50}$-alkyl, C$_{2-50}$-alkenyl and C$_{2-50}$-alkynyl,
wherein
C$_{1-50}$-alkyl, C$_{2-50}$-alkenyl and C$_{2-50}$-alkynyl can be substituted with one to twenty substituents independently selected from the group consisting of C$_{5-6}$-cycloalkyl, C$_{6-10}$-aryl, 5 to 10 membered heteroaryl, OR$^a$, SR$^a$, Si(R$^{Sia}$)(R$^{Sib}$)(R$^{Sic}$), —O—Si(R$^{Sia}$)(R$^{Sib}$)(R$^{Sic}$), halogen, and CN; and at least two CH$_2$-groups, but not adjacent CH$_2$-groups, of C$_{1-50}$-alkyl, C$_{2-50}$-alkenyl and C$_{2-50}$-alkynyl can be replaced by O or S, wherein
R$^a$ is independently selected from the group consisting of H, C$_{1-30}$-alkyl, C$_{2-30}$-alkenyl, C$_{2-30}$-alkynyl, C$_{5-6}$-cycloalkyl and C$_{6-10}$-aryl,
R$^{Sia}$, R$^{Sib}$ and R$^{Sic}$ are independently selected from the group consisting of H, C$_{1-30}$-alkyl, C$_{2-30}$-alkenyl, C$_{2-30}$-alkynyl, C$_{5-6}$-cycloalkyl, C$_{6-10}$-aryl, —[O—SiR$^{Sid}$R$^{Sie}$]$_o$—R$^{Sif}$,
wherein
o is an integer from 1 to 50,
R$^{Sid}$, R$^{Sie}$, R$^{Sif}$ are independently selected from the group consisting of H, C$_{1-30}$-alkyl, C$_{2-30}$-alkenyl, C$_{2-30}$-alkynyl, C$_{5-6}$-cycloalkyl, C$_{6-10}$-aryl, —[O—SiR$^{Sig}$R$^{Sih}$]$_p$—R$^{Sii}$,
wherein
p is an integer from 1 to 50,
R$^{Sig}$R$^{Sih}$, R$^{Sii}$ are independently selected from the group consisting of H, C$_{1-30}$-alkyl, C$_{2-30}$-alkenyl, C$_{2-30}$-alkynyl, C$_{5-6}$-cycloalkyl, C$_{6-10}$-aryl, O—Si(CH$_3$)$_3$,
C$_{1-30}$-alkyl, C$_{2-30}$-alkenyl and C$_{2-30}$-alkynyl can be substituted with one to ten substituents selected from the group consisting of halogen and CN,
R$^2$ is at each occurrence selected from the group consisting of hydrogen, unsubstituted C$_{1-30}$-alkyl and halogen, and
Y is at each occurence I, Br, Cl or —O—S(O)$_2$CF$_3$.

In more preferred intermediates of formulae (2) and (2')
$R^1$ is at each occurrence selected from the group consisting of C$_{1-36}$-alkyl, C$_{2-36}$-alkenyl and C$_{2-36}$-alkynyl,
wherein
C$_{1-36}$-alkyl, C$_{2-36}$-alkenyl and C$_{2-36}$-alkynyl can be substituted with one to twenty substituents independently selected from the group consisting of C$_{5-6}$-cycloalkyl, C$_{6-10}$-aryl, 5 to 10 membered heteroaryl, OR$^a$, SR$^a$, Si(R$^{Sia}$)(R$^{Sib}$)(R$^{Sic}$), —O—Si(R$^{Sia}$)(R$^{Sib}$)(R$^{Sic}$), halogen, and CN; and at least two CH$_2$-groups, but not adjacent CH$_2$-groups, of C$_{1-36}$-alkyl, C$_{2-36}$-alkenyl and C$_{2-36}$-alkynyl can be replaced by O or S,
wherein
R$^a$ is independently selected from the group consisting of H, C$_{1-20}$-alkyl, C$_{2-20}$-alkenyl, C$_{2-20}$-alkynyl, C$_{5-6}$-cycloalkyl and C$_{6-10}$-aryl
R$^{Sia}$, R$^{Sib}$ and R$^{Sic}$ are independently selected from the group consisting of H, C$_{1-20}$-alkyl, C$_{2-20}$-alkenyl, C$_{2-20}$-alkynyl, C$_{5-6}$-cycloalkyl, C$_{6-10}$-aryl, —[O—SiR$^{Sid}$R$^{Sie}$]$_o$—R$^{Sif}$
wherein
o is an integer from 1 to 50,
R$^{Sid}$, R$^{Sie}$, R$^{Sif}$ are independently selected from the group consisting of H, C$_{1-30}$-alkyl, C$_{2-20}$-alkenyl, C$_{2-20}$-alkynyl, C$_{5-6}$-cycloalkyl, C$_{6-10}$-aryl, —[O—SiR$^{Sig}$R$^{Sih}$]$_p$—R$^{Sii}$,
wherein
is an integer from 1 to 50,
R$^{Sig}$ R$^{Sih}$, R$^{Sii}$ are independently selected from the group consisting of H, C$_{1-30}$-alkyl, C$_{2-20}$-alkenyl, C$_{2-20}$-alkynyl, C$_{5-6}$-cycloalkyl, C$_{6-10}$-aryl, O—Si(CH$_3$)$_3$,
C$_{1-20}$-alkyl, C$_{2-20}$-alkenyl and C$_{2-20}$-alkynyl can be substituted with one to ten substituents selected from the group consisting of halogen and CN,
R$^2$ is at each occurrence selected from the group consisting of hydrogen, unsubstituted C$_{1-30}$-alkyl and halogen, and
Y is at each occurence I, Br, Cl or —O—S(O)$_2$CF$_3$.

In even more preferred intermediates of formulae (2) and (2')

$R^1$ is at each occurrence unsubstituted $C_{1-36}$-alkyl, $R^2$ is hydrogen and Y is at each occurence I, Br, Cl or —O—S(O)$_2$CF$_3$.

In most preferred intermediates of formula (2)

Y is at each occurence I, Br or O—S(O)$_2$CF$_3$, and $R^1$ is at each occurrence unsubstituted $C_{1-36}$-alkyl and $R^2$ is hydrogen.

Particular preferred intermediate of formula (2)

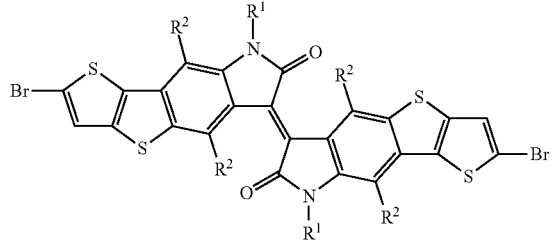

(2-II)

wherein, $R^1$ is at each occurrence unsubstituted $C_{1-36}$-alkyl and $R^2$ is hydrogen.

Also part of the invention is an electronic device comprising the polymer of the present invention.

The electronic device can be an organic photovoltaic device (OPVs), an organic field-effect transistor (OFETs), an organic light emitting diode (OLEDs) or an organic photodiode (OPDs).

Preferably, the electronic device is an organic photovoltaic device (OPVs), an organic field-effect transistor (OFETs) or an organic photodiode (OPDs).

More preferably, the electronic device is an organic field effect transistor (OFET).

Usually, an organic field effect transistor comprises a dielectric layer, a semiconducting layer and a substrate. In addition, an organic field effect transistor usually comprises a gate electrode and source/drain electrodes.

Preferably, the semiconducting layer comprises the polymer of the present invention. The semi-conducting layer can have a thickness of 5 to 500 nm, preferably of 10 to 100 nm, more preferably of 20 to 50 nm.

The dielectric layer comprises a dielectric material. The dielectric material can be silicon dioxide or aluminium oxide, or, an organic polymer such as polystyrene (PS), poly(methylmethacrylate) (PMMA), poly(4-vinylphenol) (PVP), poly(vinyl alcohol) (PVA), benzocyclobutene (BCB), or polyimide (PI). The dielectric layer can have a thickness of 10 to 2000 nm, preferably of 50 to 1000 nm, more preferably of 100 to 800 nm.

The dielectric layer can in addition to the dielectric material comprise a self-assembled monolayer of organic silane derivates or organic phosphoric acid derivatives. An example of an organic silane derivative is octyltrichlorosilane. An examples of an organic phosphoric acid derivative is octyldecylphosphoric acid. The self-assembled monolayer comprised in the dielectric layer is usually in contact with the semiconducting layer.

The source/drain electrodes can be made from any suitable organic or inorganic source/drain material. Examples of inorganic source/drain materials are gold (Au), silver (Ag) or copper (Cu), as well as alloys comprising at least one of these metals. The source/drain electrodes can have a thickness of 1 to 100 nm, preferably from 20 to 70 nm.

The gate electrode can be made from any suitable gate material such as highly doped silicon, aluminium (Al), tungsten (W), indium tin oxide or gold (Au), or alloys comprising at least one of these metals. The gate electrode can have a thickness of 1 to 200 nm, preferably from 5 to 100 nm.

The substrate can be any suitable substrate such as glass, or a plastic substrate such as polyethersulfone, polycarbonate, polysulfone, polyethylene terephthalate (PET) and polyethylene naphthalate (PEN). Depending on the design of the organic field effect transistor, the gate electrode, for example highly doped silicon can also function as substrate.

The organic field effect transistor can be prepared by methods known in the art.

For example, a bottom-gate top-contact organic field effect transistor can be prepared as follows: The dielectric material, for example Al$_2$O$_3$ or silicon dioxide, can be applied as a layer on a gate electrode such as highly doped silicon wafer, which also functions as substrate, by a suitable deposition method such as atom layer deposition or thermal evaporation. A self-assembled monolayer of an organic phosphoric acid derivative or an organic silane derivative can be applied to the layer of the dielectric material. For example, the organic phosphoric acid derivative or the organic silane derivative can be applied from solution using solution-deposition techniques. The semiconducting layer can be formed by either solution deposition or thermal evaporation in vacuo of the polymer of the present invention on the self-assembled monolayer of the organic phosphoric acid derivative or the organic silane derivative. Source/drain electrodes can be formed by deposition of a suitable source/drain material, for example tantalum (Ta) and/or gold (Au), on the semiconducting layer through a shadow masks. The channel width (W) is typically 10 to 1000 μm and the channel length (L) is typically 5 to 500 μm.

For example, a top-gate bottom-contact organic field effect transistor can be prepared as follows: Source/drain electrodes can be formed by evaporating a suitable source/drain material, for example gold (Au), on photo-lithographically defined electrodes on a suitable substrate, for example a glass substrate. The semiconducting layer can be formed by depositing a solution of the polymers of the present invention, for example by spin-coating, on the source/drain electrodes, followed by annealing the layer at elevated temperatures such as at a temperature in the range of 80 to 360° C. After quenching the semiconducting layer, a dielectric layer can be formed by applying, for example, by spin-coating, a solution of a suitable dielectric material such as poly(methylmethacryate), on the semiconducting layer. The gate electrode of a suitable gate material, for example gold (Au), can be evaporated through a shadow mask on the dielectric layer.

Also part of the invention is the use of the polymer of the present invention as semiconducting material.

The polymers of the present invention show high charge carrier mobilities. The polymer of the present invention can show ambipolar properties with high hole and electron mobilities. In addition, the polymers of the present invention show a high stability, in particular a high thermal stability. Furthermore the polymers of the present invention are compatible with liquid processing techniques. In addition, the polymers of the present invention show a strong absorption of the near infra-red light.

EXAMPLES

Figure 2:
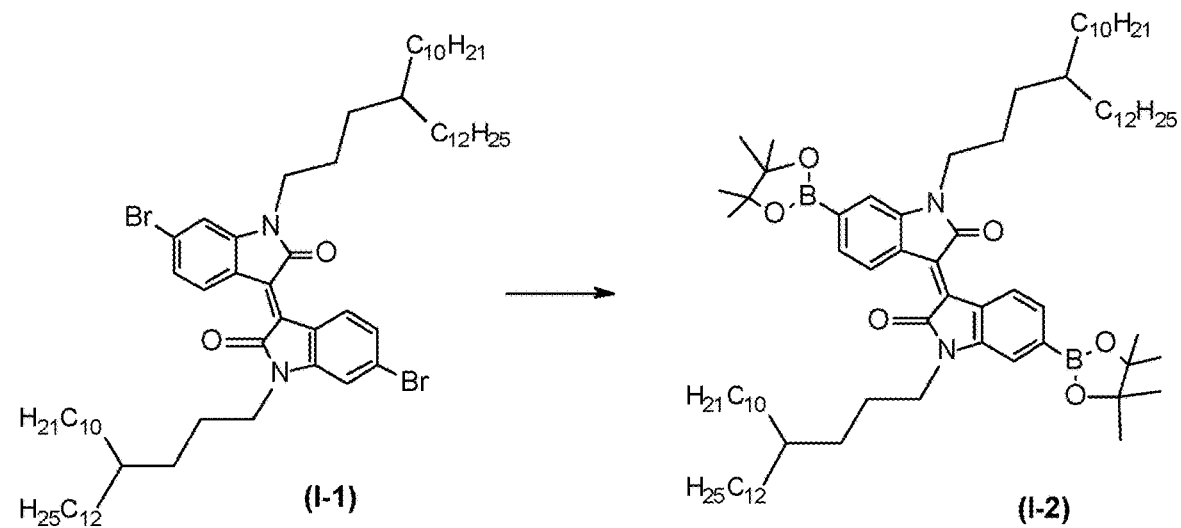
FIG. 2 shows the synthesis of 6,6'-diborate ester-isoindigo (I-2) in Example 1 b).

Example 1 a) Synthesis of Compound I-1 is Made is Made in Analogy to the Literature by Alkylation of 6,6'-dibromoisoindigo, as shown in FIG. 1.

b) Synthesis of 6,6'-diborate Ester-Isoindigo (I-2) as shown in FIG. 2.

Figure 3:
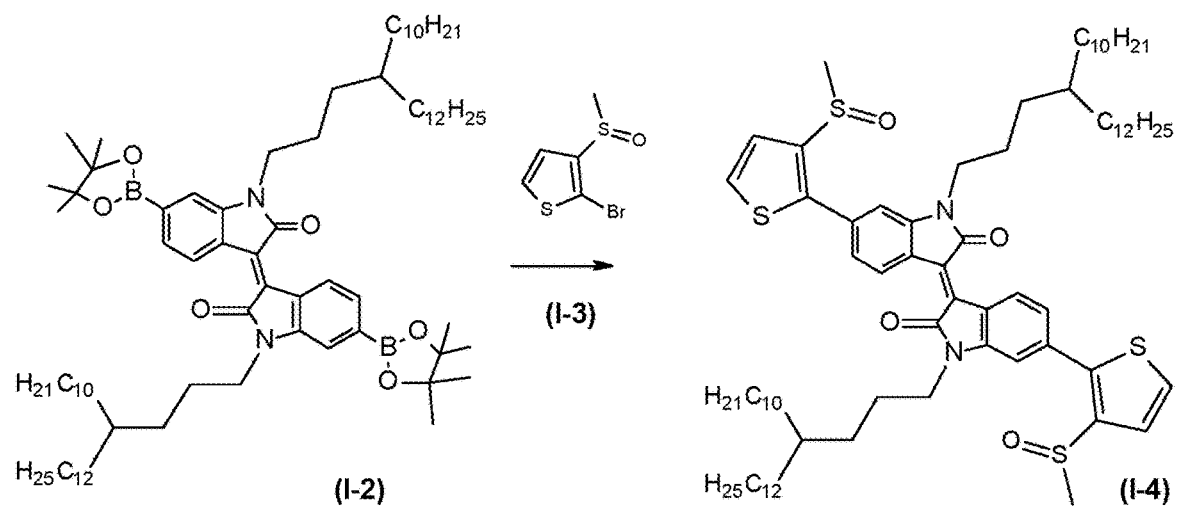
FIG. 3 shows the synthesis of 6, 6'-di(3-methylsulfinyl-thiophene) isoindigo (I4) in Example 1 c).

A mixture of 6,6'-dibromoisoindigo I-1 (3 g, 2.75 mmol), bis(pinacolato)diboron (1.75 g, 6.88 mmol), Pd(PPh$_3$)$_2$Cl$_2$ (190 mg, 0.275 mmol) and potassium acetate (1.08 g, 11 mmol) in anhydrous toluene (50 mL) are heated to 110° C. for 16 h under argon. The reaction mixture is then cooled to r.t and plugged through a short pad silica gel with methylene chloride. The collected filtration is concentrated and dried to give 6, 6'-diborate ester isoindigo without further purification as a dark red solid (2.65 g, 81%). $^1$H NMR (400 MHz, CDCl$_3$, 300 K), δ (ppm): 9.14 (d, $^3$J=7.9 Hz, 2H), 7.48 (dd, $^3$J=7.9, $^4$J=0.6 Hz, 2H), 7.16 (s, 2H), 3.70-3.68 (m, 4H), 1.96 (t, 2H), 1.36 (s, 24H), 1.35-1.24 (m, 80H), 0.89-0.85 (m, 12H). $^{13}$C NMR (100 MHz, CDCl$_3$, 300 K), δ (ppm): 168.09, 144.47, 134.31, 128.88, 128.74, 124.24, 113.50, 84.03, 44.45, 31.94, 30.02, 29.66, 29.37, 24.88, 22.70, 14.13.

c) Synthesis of 6, 6'-di(3-methylsulfinylthiophene) Isoindigo (I-4) as shown in FIG. 3.

Figure 4:
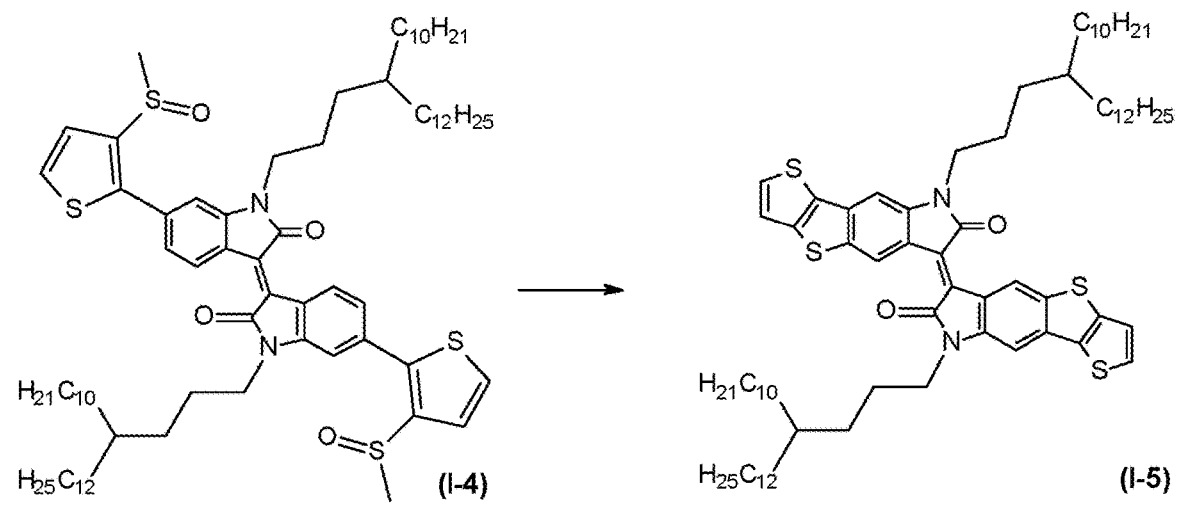
FIG. 4 shows the synthesis of BTTIID (I-5) in Example 1 d).

To an oven-dried 20 mL microwave vial, 6, 6'-diborate easter-isoindigo (I-2) (1.0 g, 7.7 mmol), Pd$_2$(dba)$_3$ (38 mg, 0.038 mmol) and P-(o-tol)$_3$ (46 mg, 0.15 mmol), Bromo-3-methylsulfinylthiophene (I-3, made in analogy to the literature) (430 mg, 19.25 mol), the tube is sealed, then toluene (10 mL) with 2 drops of aliquat and 2M K$_3$PO$_4$ (3.5 mL) are added. The mixture is degassed under Argon for half an hour, and then the argon inlet is removed. The tube is subjected to reflux for 18 h. After cooling to room temperature, the reaction mixture is extracted with EA, and the organic phase is collected and dried with magnesium sulfate, solvent is removed by the reduced pressure, purified by column chromatography (eluent: DCM:EA=10:1) to afford a dark red solid (530 mg, 53%). $^1$H NMR (400 MHz, CDCl3, 300 K) δ (ppm): 9.26 (d, $^3$J=8.3 Hz, 2H), 7.66 (d, $^3$J=5.4 Hz, 2H), 7.50 (d, $^3$J=5.4 Hz, 2H), 7.12 (dd, $^3$J=8.3, $^4$J=1.6 Hz, 2H), 6.95 (d, $^4$J=1.4 Hz, 2H), 3.76-3.65 (m, 4H), 2.79 (s, 6H), 1.94 (t, 2H), 1.37-1.23 (m, 80H), 0.88-0.84 (m, 12H). $^{13}$C NMR (100 MHz, CDCl$_3$, 300 K), δ (ppm): 168.53, 145.66, 143.24, 135.45, 132.98, 130.72, 127.27, 125.41, 123.22, 122.00, 108.69, 44.05, 31.92, 31.76, 30.08, 29.63, 29.36, 26.52, 22.69, 14.12. HRMS (ESI, pos. mode): Calculated for C74H115N2O4S4: 1223.7661, [M+H]+, found: 1223.7594.

d) Synthesis of BTTIID (I-5) as shown in FIG. 4.

6,6'-di(3-methylsulfinylthiophene) isoindigo (I-4) (800 mg, 0.65 mmol) is stirred with Eaton's reagent (6 mL) at room temperature in the dark for 3 days. The mixture is poured into ice-water, extracted with chloroform and the organic phased is dried with MgSO4, the solvent is removed by reduced pressure and the crude product is dried in vacuum, which is followed to be redissolved in pyridine (10 mL) and then the mixture is refluxed overnight. After the mixture is cooled to room temperature, extracted with chloroform and diluted hydrochloride acid, the separated organic phase is dried over MgSO4, and solvent is removed by reduced pressure. The crude is purified by column chromatography on silica gel (eluent: CHCl$_3$:PE=1:3) to afford a red solid BTTIID (I-5) (450 mg, 59%). $^1$H NMR (400 MHz, CDCl$_3$, 300 K) δ (ppm): 9.81 (s, 2H), 7.56 (d, $^3$J=5.1 Hz, 2H), 7.32 (d, $^3$J=5.1 Hz, 2H), 6.98 (s, 2H), 3.72-3.70 (m, 4H), 1.99 (t, 2H), 1.38-1.21 (m, 80H), 0.88-0.83 (m, 12H). $^{13}$C NMR (100 MHz, CDCl$_3$, 300 K), δ (ppm): 168.52, 142.60, 142.18, 136.62, 134.86, 134.48, 132.12, 129.38, 125.86, 120.74, 120.07, 99.45, 44.74, 31.93, 31.67, 30.05, 29.68, 29.36, 26.54, 22.69, 14.12. MS (MALDI-TOF, CHCl$_3$): Calculated for C72H106N2O2S4: 1158.71, found: 1158.4. UV-vis (CHCl$_3$): Imax/nm (e/M-1 cm-1)=510 (36700). CV (CH$_2$O$_{12}$, 0.1 M TBAHFP, vs Fc/Fc$^+$): $E_{1/2red}$ (X/X$^-$)=−1.28 V, $E_{1/2red}$ (X/X$^{2-}$)=−1.64 V, $E_{1/2ox}$ (X/X$^+$)= 0.78 V

Example 2

Figure 5:
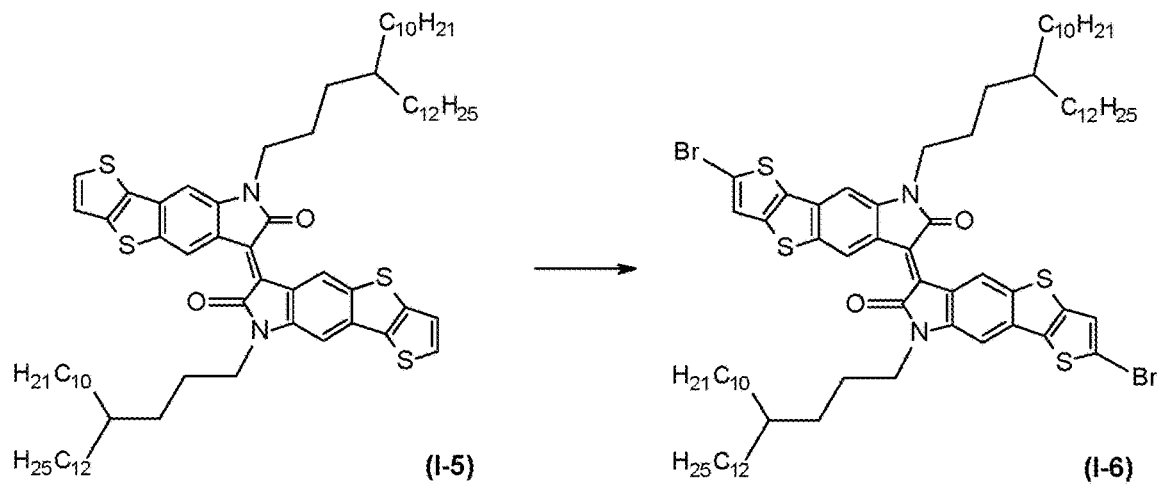
FIG. 5 shows the synthesis of dibromo BTTIID (I-6) in Example 2.

Synthesis of Dibromo BTTIID (I-6) as shown in FIG. 5.

NBS (65 g, 0.36 mmol) is added in small portions to a solution of benzothienothiophene isoindigo (200 g, 0.17 mmol) in CHCl$_3$/AcOH (20 mL: 5 mL), the reaction mixture is stirred at reflux for about 5 h, which can be monitored by TLC. When the reaction is finished, cooled down to room temperature, the solvent is removed by reduced pressure and purified by column chromatography on silica gel (eluent: CHCl$_3$:PE=1:4) to afford a red solid dibromo-BTTIID (I-6) (164 mg, 72%). $^1$H NMR (400 MHz, CDCl$_3$, 300 K), δ (ppm): 9.70 (s, 2H), 7.23 (s, 2H), 6.67 (s, 2H), 3.66-3.64 (m, 4H), 1.92 (t, 2H), 1.37-1.21 (m, 80H), 0.88-0.83 (m, 12H). $^{13}$C NMR (100 MHz, CDCl$_3$, 300 K), δ (ppm): 168.25, 142.62, 140.63, 135.07, 134.79, 133.61, 131.87, 125.68, 123.27, 120.07, 116.14, 98.77, 44.72, 31.94, 30.08, 29.75, 29.69, 29.39, 26.61, 22.71, 14.13. MS (MALDI-TOF, CHCl$_3$): Calculated for C72H104Br2N2O2S4: 1314.5, found: 1314.1.

Example 3

Figure 6:
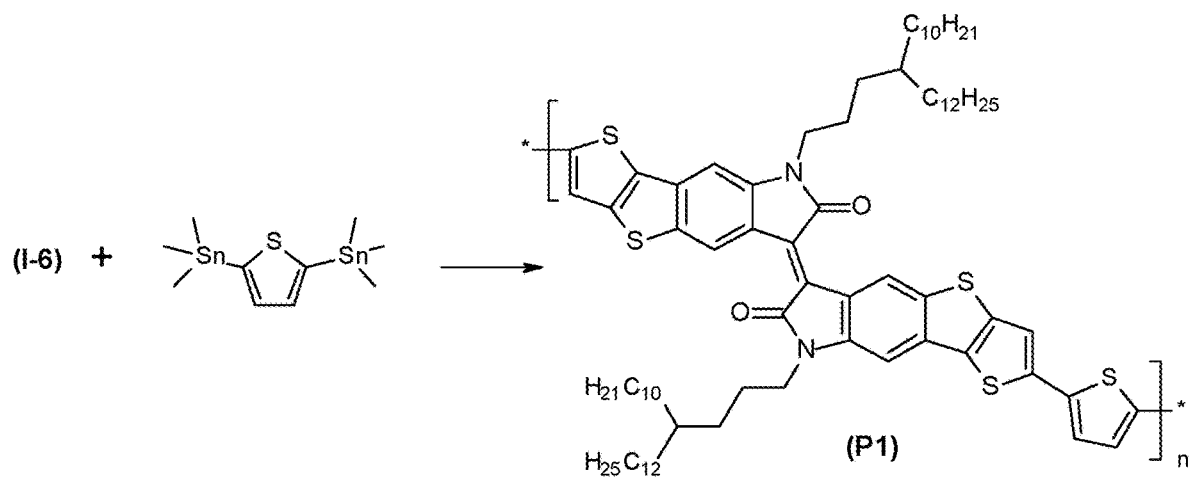
FIG. 6 shows the synthesis of P1 in Example 3.

Synthesis of P1 as shown in FIG. 6.

To a microwave vial is added dibromoBTTIID (I-6) (100 mg, 0.076 mmol, 1 equiv.) and 2,5-bis(trimethylstannyl) thiophene (31.04 mg, 0.076 μmol, 1 equiv), Pd2(dba)3 (1.50 mg) and P(o-Tol)$_3$ (1.84 mg). The tube is sealed and flushed with Argon, and then degassed chlorobenzene (2 mL) is added. The mixture is thoroughly degassed under Argon, and then the argon inlet is removed. The tube is subjected to the following conditions in a microwave reactor: 100° C. for 5 min, 140° C. for 5 min, 160° C. for 30 min. After cooling to RT, the polymer is precipitated into methanol, and filtered through a Soxhlet thimble. The polymer is extracted using Soxhlet apparatus with methanol, acetone, hexane, dichloromethane, chloroform and chlorobenzene. The chlorobenzene solution is concentrated and precipitated into methanol. The precipitates are filtered and dried under vacuum to afford P1 as a dark blue solid (40 mg, 40%). GPC (chlorobenzene, 80° C.): Mn 33000, Mw 91135 g mol-1, PDI=2.74. $^1$H NMR (1,1,2,2-tetrachloroethane-d$_2$, 130° C., 400 MHz), δ (ppm): 9.68 (broad), 6.63 (broad), 3.96–3.89 (broad), 2.15–2.13 (broad), 1.76–0.96 (broad).

Example 4

Figure 7:
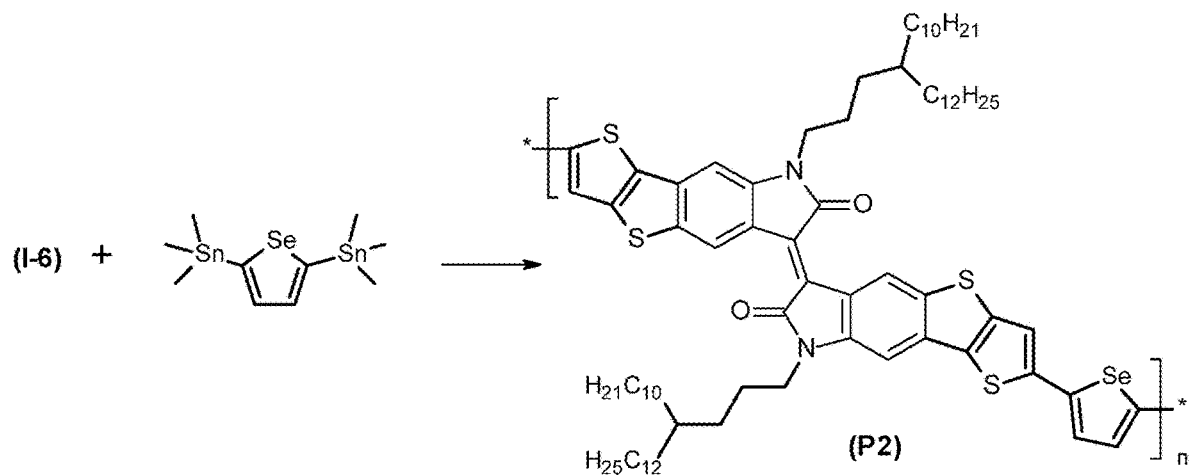
FIG. 7 shows the synthesis of P2 in Example 4.

Synthesis of P2 as shown in FIG. 7.

To a microwave vial is added dibromoBTTIID (I-6) (68.6 mg, 0.052 mmol, 1 equiv.) and 2,5-bis(trimethylstannyl) selenophene (23.78 mg, 0.052 µmol, 1 equiv), Pd2(dba)3 (2 mg) and P(o-Tol) 3 (2.58 mg). The tube is sealed and flushed with Argon, and then degassed chlorobenzene (1.0 mL) is added. The mixture is thoroughly degassed under Argon, and then the argon inlet is removed. The tube is subjected to the following conditions in a microwave reactor: 100° C. for 5 min, 140° C. for 5 min, 160° C. for 30 min. After cooling to RT, the polymer is precipitated into methanol, and filtered through a Soxhlet thimble. The polymer is extracted using Soxhlet apparatus with methanol, acetone, hexane, dichloromethane, chloroform and chlorobenzene. The chloroform and chlorobenzene solution is concentrated and precipitated into methanol. The precipitates are filtered and dried under vacuum to afford P2 as a dark blue solid (55 mg (chloroform) and 6 mg (chlorobenzene), 87.1%). $^1$H NMR (1,1,2,2-tetrachloroethane-d2, 130° C., 400 MHz), δ (ppm): 9.67 (broad), 6.49 (broad), 3.96–3.87 (broad), 1.64–0.96 (broad). GPC (chloroform fraction) (chlorobenzene, 80° C.): Mn 51500, Mw 17966 g mol-1, PDI=3.49.

Example 5

Synthesis of P3

Figure 8:
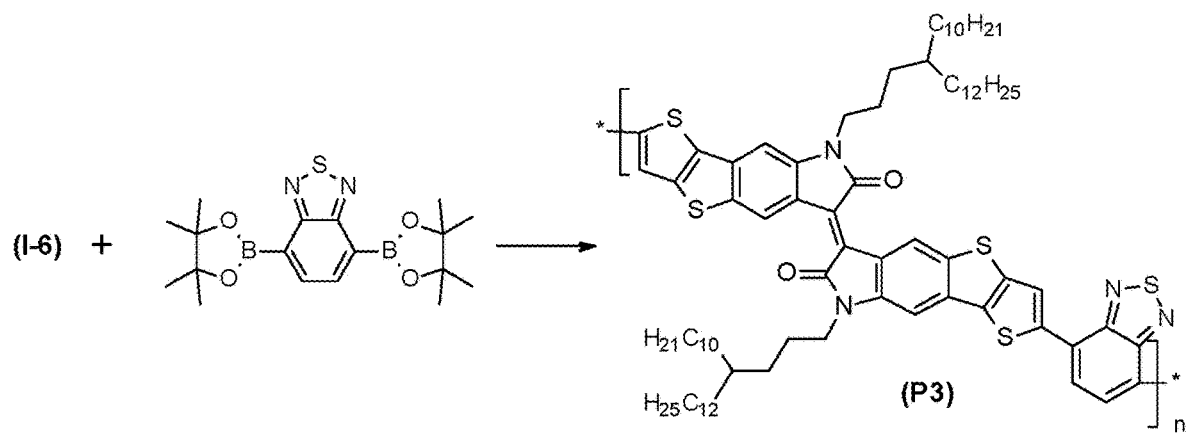
FIG. 8 shows the synthesis of P3 in Example 5.

The synthesis of polymer P3 is made in analogy to the synthesis of polymer P2, as shown in FIG. 8.

Example 6

Synthesis of P4

Figure 9:
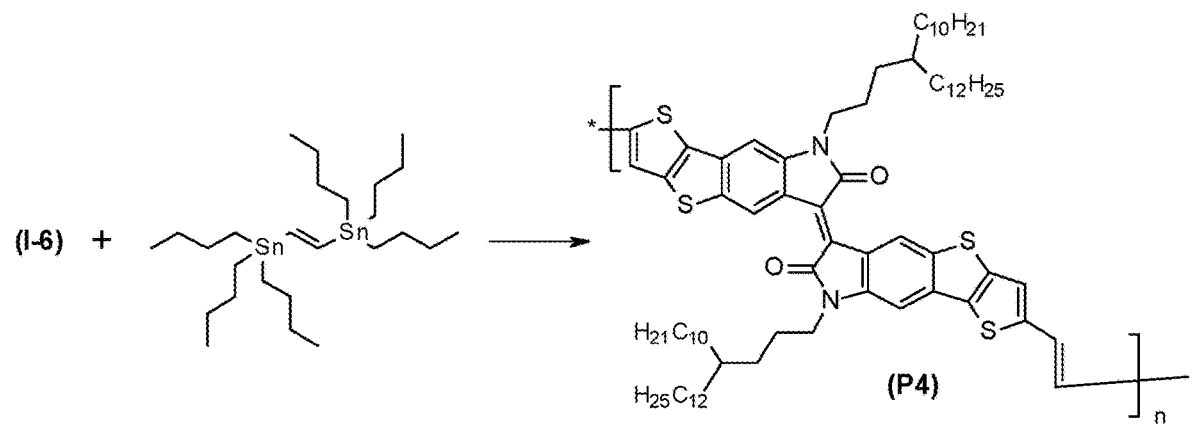
FIG. 9 shows the synthesis of P4 in Example 6.

The synthesis of polymer P4 is made in analogy to the synthesis of polymer P2, as shown in FIG. 9.

Example 7

Synthesis of P5

Figure 10:
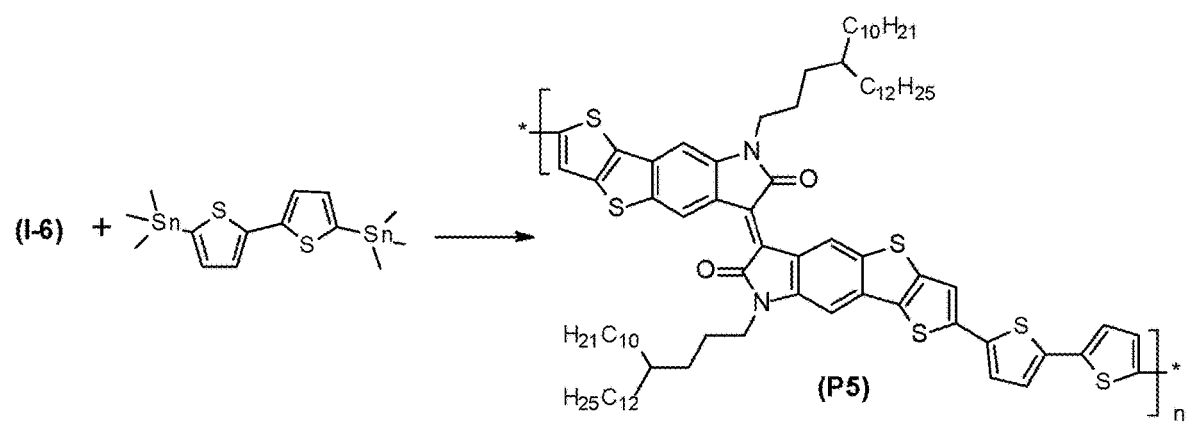
FIG. 10 shows the synthesis of P5 in Example 7.

The synthesis of polymer P5 is made in analogy to the synthesis of polymer P2, as shown in FIG. 10.

Example 8

Synthesis of Compound (I-7)

Compound I-7 is synthesized in analogy to compound I-5

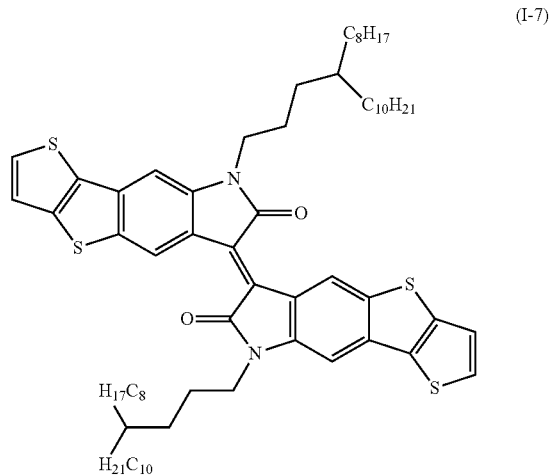

(I-7)

Example 9

Synthesis of Compound (I-8)

Compound I-8 is synthesized from I-7 in analogy to compound I-6

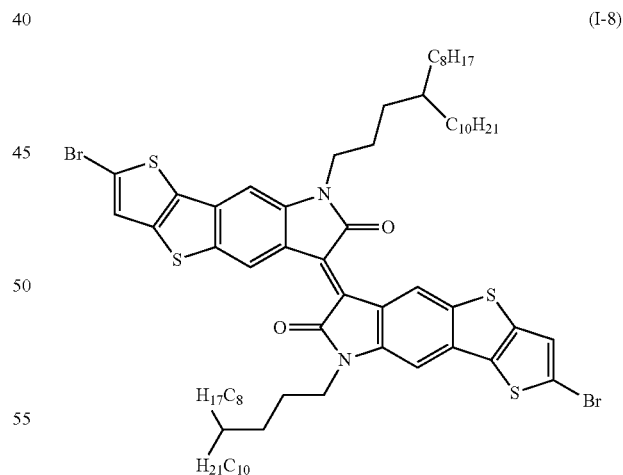

(I-8)

Example 10

Synthesis of Polymer (P6)

Figure 11:
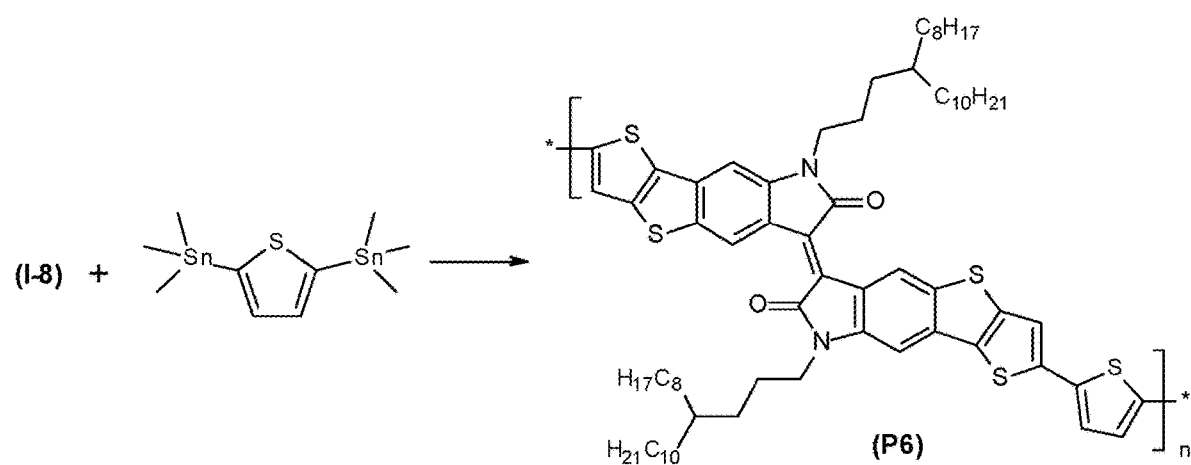
FIG. 11 shows the synthesis of polymer (P6) in Example 10.

Polymer P6 is synthesized from I-8 in analogy to polymer P2, as shown in FIG. 11.

Example 11

Synthesis of Compound (I-9)

Compound I-9 is synthesized in analogy to compound I-5

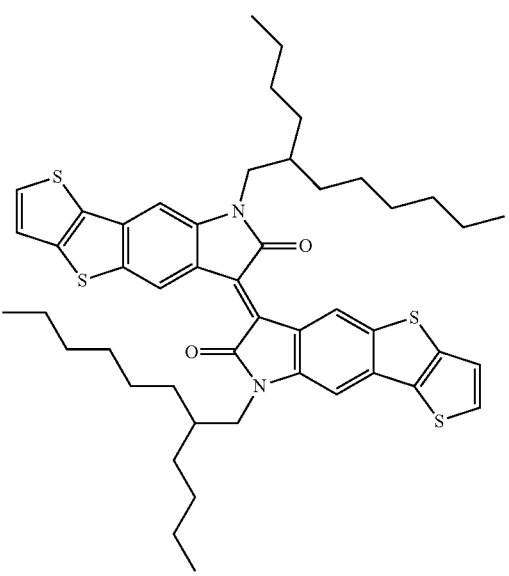

(I-9)

Example 12

Fabrication and Electrical Characterization of Organic Field-Effect Transistors (OFET) Based on Compounds and Polymers of the Present Invention Preparation of Back-Contact, Top-Gate FETs Semiconducting compound I-x or polymer Px is dissolved at a concentration of 0.75 wt % in orthodichlorobenzene and subsequently coated onto a PET-substrate with lithographically prepatterned gold contacts, serving as Source and Drain contact of the FET. 100 µl of the formulation is coated by a standard blade coater at a coating speed of 20 mm/s, yielding a homogenous layer of the semiconductor over the entire substrate. After the coating is completed, the substrate is immediately transferred onto a preheated hotplate and heated for 30 s at 90° C. Next the gate dielectric layer consisting of Cytop CTL-809M is spincoated on top of the organic semiconductor (1200 rpm, 30 s). After Spincoating, the substrate is again transferred to the hotplate and annealed for another 5 Min at 100° C. The thickness of the dielectric layer is 535 nm measured by profilometer. Finally 50 nm thick shadow-mask patterend gold gate electrodes are deposited by vacuum evaporation to complete FETs in the BGTC-configuration (See FIG. 1a-h)

Electrical Characterization

The mobility µ is calculated from the root representation of the transfer characteristic curve (solid grey curve) calculated in the saturation region. The slope m is determined from the dashed black line in FIG. 1. The dashed black line in FIG. 1 is fitted to a region of the root representation of the current characteristic ID such that a good correlation to the linear slope of the root representation is obtained.

The threshold voltage $U_{Th}$ can be taken from the intersection of black dashed line in FIG. 1 with the X-axis portion ($V_{GS}$).

In order to calculate the electrical properties of the OFET, the following equations are employed:

$$\mu = \frac{m^2 * 2L}{C_G * W}$$

$$C_G = \varepsilon_0 * \varepsilon_r \frac{1}{d}$$

$$U_{Th} = -1 * \frac{m}{b}$$

$$ON/OFF = \frac{I_D \max}{I_D \min}$$

where $\varepsilon_0$ is the vacuum permittivity of $8.85 \times 10^{-12}$ As/Vm. $\varepsilon_r = 2.1$ for Cytop and d=535 nm is the thickness of the dielectric. With the channel length L=10 µm and the channel width W=250 µm.

The following mobilities have been calculated for the respective compounds:

| Compound I-x Polymer Px | Field-effect mobility µ [cm²/Vs] | Threshold voltage $U_{TH}$ [V] | ON/OFF ratio |
| --- | --- | --- | --- |
| I-7 | 1.3E−2 | 0.72 | 5E3 |
| I-9 | 6E−4 | −10.8 | 8E2 |
| P6 | 3E−3 | −6.0 | 1E3 |
| P1 high Mw | 4.5E−2 | −4.7 | 6E4 |
| P3 | 5E−4 | −13.87 | 7E2 |
| P1 low Mw | 9E−3 | −3.62 | 9E3 |
| P2 | 5E−2 | −2.05 | 1E4 |
| P4 | 2E−3 | 7.5 | 3E8 |

The invention claimed is:

1. A polymer comprising at least one unit of formula (1):

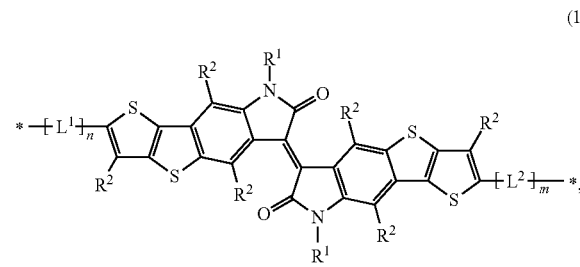

(1)

wherein $R^1$ is at each occurrence selected from the group consisting of H, $C_{1-100}$-alkyl, $C_{2-100}$-alkenyl, $C_{2-100}$-alkynyl, $C_{5-12}$-cycloalkyl, $C_{6-18}$-aryl, a 5 to 20 membered heteroaryl, C(O)—$C_{1-100}$-alkyl, C(O)—$C_{5-12}$-cycloalkyl and C(O)—O$C_{1-100}$-alkyl, wherein $C_{1-100}$-alkyl, $C_{2-100}$-alkenyl and $C_{2-100}$-alkynyl can be substituted with one to forty substituents independently selected from the group consisting of $C_{5-8}$cycloalkyl, $C_{6-14}$-aryl, 5 to 14 membered heteroaryl, OR$^a$, OC(O)—R$^a$, C(O)—OR$^a$, C(O)—R$^a$, NR$^a$R$^b$, NR$^a$—C(O)R$^b$, C(O)—NR$^a$R$^b$, N[C(O)R$^a$][C(O)R$^b$], SR$^a$, Si(R$^{Sia}$)(R$^{Sib}$)(R$^{Sic}$), —O—Si(R$^{Sia}$)(R$^{Sib}$)(R$^{Sic}$), halogen, CN, and NO$_2$; and at least two CH$_2$-groups, but not adjacent CH$_2$-groups, of $C_{1-100}$-alkyl, $C_{2-100}$-alkenyl and $C_{2-100}$-alkynyl can be replaced by O or S, $C_{5-12}$-cycloalkyl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^aR^b$, $NR^a$—$C(O)R^b$, $C(O)$—$NR^aR^b$, $N[C(O)R^a][C(O)R^b]$, $SR^a$, $Si(R^{Sia})(R^{Sib})(R^{Sic})$, —O—$Si(R^{Sia})(R^{Sib})(R^{Sic})$, halogen, CN, and $NO_2$; and one or two $CH_2$-groups, but not adjacent $CH_2$-groups, of $C_{5-12}$-cycloalkyl can be replaced by O, S, OC(O), CO, $NR^a$ or $NR^a$—CO, $C_{6-18}$-aryl and 5 to 20 membered heteroaryl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^aR^b$, $NR^a$—$C(O)R^b$, $C(O)$—$NR^aR^b$, $N[C(O)R^a][C(O)R^b]$, $SR^a$, $Si(R^{Sia})(R^{Sib})(R^{Sic})$, —O—$Si(R^{Sia})(R^{Sib})(R^{Sic})$, halogen, CN, and $NO_2$, wherein $R^a$ and $R^b$ are independently selected from the group consisting of H, $C_{1-60}$-alkyl, $C_{2-60}$-alkenyl, $C_{2-60}$-alkynyl, $C_{5-8}$cycloalkyl, $C_{6-14}$-aryl and 5 to 14 membered heteroaryl, $R^{Sia}$, $R^{Sib}$ and $R^{Sic}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, O—$C_{1-60}$-alkyl, O—$C_{2-60}$-alkenyl, O—$C_{2-60}$-alkynyl, O—$C_{5-8}$-cycloalkyl, O—$C_{6-14}$-aryl, O-5 to 14 membered heteroaryl, —[O—$SiR^{Sid}R^{Sie}]_o$—$R^{Sif}$, $NR^5R^6$, halogen and O—C(O)—$R^5$, wherein o is an integer from 1 to 50, $R^{Sid}$, $R^{Sie}$, $R^{Sif}$ independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, O—$C_{1-60}$-alkyl, O—$C_{2-60}$-alkenyl, O—$C_{2-60}$-alkynyl, O—$C_{5-8}$-cycloalkyl, O—$C_{6-14}$-aryl, O-5 to 14 membered heteroaryl, —[O—$SiR^{Sig}R^{Sih}]_p$—$R^{Sii}$, $NR^{50}R^{60}$, halogen and O—C(O)—$R^{50}$;

wherein p is an integer from 1 to 50, $R^{Sig}$, $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, O—$Si(CH_3)_3$, $NR^{500}R^{600}$, halogen and O—C(O)—$R^{500}$, $R^5$, $R^6$, $R^{50}$, $R^{60}$, $R^{500}$ and $R^{600}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, and 5 to 14 membered heteroaryl, $C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, $OR^c$, $OC(O)$—$R^c$, $C(O)$—$OR^c$, $C(O)$—$R^c$, $NR^cR^d$, $NR^c$—$C(O)R^d$, $C(O)$—$NR^cR^d$, $N[C(O)R^c][C(O)R^d]$, $SR^c$, $Si(R^{Sij})(R^{Sik})(R^{Sil})$, —O—$Si(R^{Sij})(R^{Sik})(R^{Sil})$, halogen, CN, and $NO_2$; and at least two $CH_2$-groups, but not adjacent $CH_2$-groups, of $C_{1-60}$-alkyl, $C_{2-60}$-alkenyl and $C_{2-60}$-alkynyl can be replaced by O or S, $C_{5-8}$-cycloalkyl can be substituted with one to five substituents selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^e$, $OC(O)$—$R^e$, $C(O)$—$OR^e$, $C(O)$—$R^e$, $NR^eR^d$, $NR^e$—$C(O)R^d$, $C(O)$—$NR^eR^d$, $N[C(O)R^e][C(O)R^d]$, $SR^e$, $Si(R^{Sij})(R^{Sik})(R^{Sil})$, —O—$Si(R^{Sij})(R^{Sik})$ ($R^{Sil}$), halogen, CN, and $NO_2$; and one or two $CH_2$-groups, but not adjacent $CH_2$-groups, of $C_{5-8}$-cycloalkyl can be replaced by O, S, OC(O), CO, $NR^c$ or $NR^c$—CO, $C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^cR^d$, $NR^c$—$C(O)R^d$, $C(O)$—$NR^cR^d$, $N[C(O)R^c][C(O)R^d]$, $SR^c$, $Si(R^{Sij})(R^{Sik})(R^{Sil})$, —O—$Si(R^{Sij})(R^{Sik})$ ($R^{Sil}$), halogen, CN and $NO_2$;

wherein $R^c$ and $R^d$ are independently selected from the group consisting of H, $C_{1-30}$-alkyl, $C_{2-30}$-alkenyl and $C_{2-30}$-alkynyl, $R^{Sij}$, $R^{Sik}$ and $R^{Sil}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, —[O—$SiR^{Sim}R^{Sin}]_q$—$R^{Sio}$, $NR^7R^8$, halogen, and O—C(O)—$R^7$, wherein q is an integer from 1 to 50, $R^{Sim}$, $R^{Sin}$, $R^{Sio}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, —[O—$SiR^{Sip}R^{Siq}]_r$—$R^{Sir}$, $NR^{70}R^{80}$, halogen, and O—C(O)—$R^{70}$;

wherein r is an integer from 1 to 50, $R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, O—$Si(CH_3)_3$, $NR^{700}R^{800}$, halogen and O—C(O)—$R^{700}$, $R^7$, $R^8$, $R^{70}$, $R^{80}$, $R^{700}$ and $R^{800}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen, CN and $NO_2$, $R^2$ is at each occurrence selected from the group consisting of hydrogen, $C_{1-30}$-alkyl, $C_{2-30}$-alkenyl, $C_{2-30}$-alkynyl, $C_{5-12}$-cycloalkyl, $C_{6-18}$-aryl, 5 to 20 membered heteroaryl, $OR^{21}$, $OC(O)$—$R^{21}$, $C(O)$—$OR^{21}$, $C(O)$—$R^{21}$, $NR^{21}R^{22}$, $NR^{21}$—$C(O)R^{22}$, $C(O)$—$NR^{21}R^{22}$, $N[C(O)R^{21}][C(O)R^{22}]$, $SR^{21}$, halogen, CN, $SiR^{Sis}R^{Sit}R^{Siu}$ and OH, wherein $R^{21}$ and $R^{22}$ are independently selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$; and at least two CH$_2$-groups, but not adjacent CH$_2$-groups, of C$_{1-30}$-alkyl, C$_{2-30}$-alkenyl and C$_{2-30}$-alkynyl can be replaced by O or S, C$_{5-12}$-cycloalkyl can be substituted with one to six substituents independently selected from the group consisting of C$_{1-20}$-alkyl, C$_{2-20}$-alkenyl and C$_{2-20}$-alkynyl, C$_{5-8}$-cycloalkyl, C$_{6-14}$-aryl, 5 to 14 membered heteroaryl, OR$^e$, OC(O)—R$^e$, C(O)—OR$^e$, C(O)—R$^e$, NR$^e$R$^f$, NR$^e$—C(O)R$^f$, C(O)—NR$^e$R$^f$, N[C(O)R$^e$][C(O)R$^f$], SR$^e$, halogen, CN, SiR$^{Sis}$R$^{Sit}$R$^{Siu}$ and NO$_2$; and one or two CH$_2$-groups, but not adjacent CH$_2$-groups, of C$_{5-12}$-cycloalkyl can be replaced by O, S, OC(O), CO, NR$^e$ or NR$^e$—CO, C$_{6-18}$-aryl and 5 to 20 membered heteroaryl can be substituted with one to six substituents independently selected from the group consisting of C$_{1-20}$-alkyl, C$_{2-20}$-alkenyl, C$_{2-20}$-alkynyl, C$_{5-8}$-cycloalkyl, C$_{6-14}$-aryl, 5 to 14 membered heteroaryl, OR$^e$, OC(O)—R$^e$, C(O)—OR$^e$, C(O)—R$^e$, NR$^e$R$^f$, NR$^e$—C(O)R$^f$, C(O)—NR$^e$R$^f$, N[C(O)R$^e$][C(O)R$^f$], SR$^e$, halogen, CN, SiR$^{Sis}$R$^{Sit}$R$^{Siu}$ and NO$_2$, wherein R$^{Sis}$, R$^{Sit}$, R$^{Siu}$ are independently from each other selected from the group consisting of H, C$_{1-20}$-alkyl, C$_{2-20}$-alkenyl, C$_{2-20}$-alkynyl, C$_{5-6}$-cycloalkyl, phenyl and O—Si(CH$_3$)$_3$, R$^e$ and R$^f$ are independently selected from the group consisting of H, C$_{1-20}$-alkyl, C$_{2-20}$-alkenyl, C$_{2-20}$-alkynyl, C$_{5-8}$-cycloalkyl, C$_{6-14}$-aryl, and 5 to 14 membered heteroaryl, wherein C$_{1-20}$-alkyl, C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^g$, OC(O)—R$^g$, C(O)—OR$^g$, C(O)—R$^g$, NR$^g$R$^h$, NR$^g$—C(O)R$^h$, C(O)—NR$^g$R$^h$, N[C(O)R$^g$][C(O)R$^h$], SR$^g$, halogen, CN, and NO$_2$;

C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^g$, OC(O)—R$^g$, C(O)—OR$^g$, C(O)—R$^g$, NR$^g$R$^h$, NR$^g$—C(O)R$^h$, C(O)—NR$^g$R$^h$, N[C(O)R$^g$][C(O)R$^h$], SR$^g$, halogen, and NO$_2$;

C$_{6-4}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^g$, OC(O)—R$^g$, C(O)—OR$^g$, C(O)—R$^g$, NR$^g$R$^h$, NR$^g$—C(O)R$^h$, C(O)—NR$^g$R$^h$, N[C(O)R$^g$][C(O)R$^h$], SR$^g$, halogen, CN, and NO$_2$;

wherein

R$^g$ and R$^h$ are independently selected from the group consisting of H, C$_{1-10}$-alkyl, C$_{2-10}$-alkenyl and C$_{2-10}$-alkynyl, wherein C$_{1-10}$-alkyl, C$_{2-10}$-alkenyl and C$_{2-10}$-alkynyl can be substituted with one to five substituents selected from the group consisting of halogen, CN and NO$_2$, n is 0, 1, 2 or 3, m is 0, 1, 2 or 3, with the proviso that at least one of n and m is not 0, and L$^1$ and L$^2$ are independently from each other and at each occurrence selected from the group consisting of

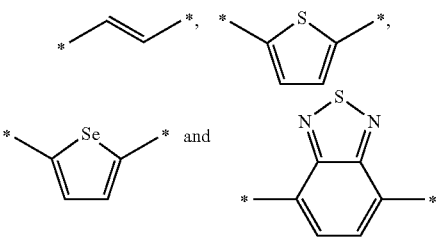

2. The polymer of claim 1, wherein

R$^1$ is at each occurrence selected from the group consisting of C$_{1-100}$-alkyl, C$_{2-100}$-alkenyl and C$_{2-100}$-alkynyl, wherein C$_{1-100}$-alkyl, C$_{2-100}$-alkenyl and C$_{2-100}$-alkynyl can be substituted with one to forty substituents independently selected from the group consisting of C$_{5-8}$-cycloalkyl, C$_{6-14}$-aryl, 5 to 14 numbered heteroaryl, OR$^a$, OC(O)—R$^a$, C(O)—OR$^a$, C(O)—R$^a$, NR$^a$—C(O)R$^b$, C(O)—NR$^a$R$^b$, SR$^a$, Si(R$^{Sia}$)(R$^{Sib}$)(R$^{Sic}$), —O—Si(R$^{Sia}$)(R$^{Sib}$)(R$^{Sic}$), halogen, and CN; and at least two CH$_2$-groups, but not adjacent CH$_2$-groups, of C$_{1-100}$-alkyl, C$_{2-100}$-alkenyl and C$_{2-100}$-alkynyl can be replaced by O or S, wherein R$^a$ and R$^b$ are independently selected from the group consisting of H, C$_{1-60}$-alkyl, C$_{2-60}$-alkenyl, C$_{2-60}$-alkynyl, C$_{5-8}$-cycloalkyl, C$_{6-14}$-aryl and 5 to 14 membered heteroaryl, R$^{Sia}$, R$^{Sib}$ and R$^{Sic}$ are independently selected from the group consisting of H, C$_{1-60}$-alkyl, C$_{2-60}$-alkenyl, C$_{2-60}$-alkynyl, C$_{5-8}$-cycloalkyl, C$_{6-14}$-aryl, —[O—SiR$^{Sid}$R$^{Sic}$]$_o$—R$^{Sif}$, wherein o is an integer from 1 to 50, R$^{Sid}$, R$^{Sie}$ and R$^{Sif}$ are independently selected from the group consisting of H, C$_{1-60}$-alkyl, C$_{2-60}$-alkenyl, C$_{2-60}$-alkynyl, C$_{5-8}$-cycloalkyl, C$_{6-14}$-aryl, —[O—SiR$^{Sig}$R$^{Sih}$]$_p$—R$^{Sii}$, wherein p is an integer from 1 to 50, R$^{Sig}$ R$^{Sih}$, R$^{Sii}$ are independently selected from the group consisting of H, C$_{1-30}$-alkyl, C$_{2-30}$-alkenyl, C$_{2-30}$-alkynyl, C$_{5-6}$-cycloalkyl, C$_{6-10}$-aryl, O—Si(CH$_3$)$_3$, R$^5$, R$^6$, R$^{50}$, R$^{60}$, R$^{500}$ and R$^{600}$ are independently selected from the group consisting of H, C$_{1-60}$-alkyl, C$_{2-60}$-alkenyl, C$_{2-60}$-alkynyl, C$_{5-8}$-cycloalkyl, C$_{6-14}$-aryl, and 5 to 14 membered heteroaryl, C$_{1-60}$-alkyl, C$_{2-60}$-alkenyl and C$_{2-60}$-alkynyl can be substituted with one to twenty substituents selected from the group consisting of C$_{5-6}$-cycloalkyl, C$_{6-10}$-aryl, OR$^c$, OC(O)—R$^c$, C(O)—OR$^c$, C(O)—R$^c$, NR$^c$—C(O)R$^d$, C(O)—NR$^c$R$^d$, SR$^c$, Si(R$^{Sij}$)(R$^{Sik}$)(R$^{Sil}$), —O—Si(R$^{Sij}$)(R$^{Sik}$)(R$^{Sil}$), halogen, and CN; and at least two CH$_2$-groups, but not adjacent CH$_2$-groups, of C$_{1-60}$-alkyl, C$_{2-60}$-alkenyl and C$_{2-60}$-alkynyl can be replaced by O or S, C$_{5-8}$-cycloalkyl can be substituted with one to five substituents selected from the group consisting of C$_{1-30}$-alkyl, C$_{2-30}$-alkenyl, C$_{2-30}$-alkynyl, C$_{5-6}$-cycloalkyl, C$_{6-10}$-aryl, OR$^c$, OC(O)—R$^c$, C(O)—OR$^c$, C(O)—R$^c$, NR$^c$—C(O)R$^d$, C(O)—NR$^c$R$^d$, SR$^c$, Si(R$^{Sij}$)(R$^{Sik}$)(R$^{Sil}$), —O—Si(R$^{Sij}$)(R$^{Sik}$)(R$^{Sil}$), halogen, and CN; and one or two CH$_2$-groups, but not adjacent CH$_2$-groups, of C$_{5-8}$-cycloalkyl can be replaced by O, S, OC(O), CO, NR$^c$ or NR$^c$—CO, $C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)$—$NR^cR^d$, $SR^c$, $Si(R^{Sij})(R^{Sik})(R^{Sil})$, —O—$Si(R^{Sij})(R^{Sik})(R^{Sil})$, halogen, and CN;

wherein $R^c$ and $R^d$ are independently selected from the group consisting of H, $C_{1-30}$-alkyl, $C_{2-30}$-alkenyl and $C_{2-30}$-alkynyl, $R^{Sij}$, $R^{Sik}$ and $R^{Sil}$ independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—$SiR^{Sim}R^{Sin}$]$_q$—$R^{Sio}$, wherein q is an integer from 1 to 50, $R^{Sim}$, $R^{Sin}$, $R^{Sio}$ independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—$SiR^{Sip}R^{Siq}$]$_r$—$R^{Sir}$, wherein r is an integer from 1 to 50, $R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—$Si(CH_3)_3$, $C_{1-30}$-alkyl, $C_{2-30}$-alkenyl and $C_{2-30}$-alkynyl can be substituted with one to ten substituents selected from the group consisting of halogen and CN, $R^2$ is at each occurrence selected from the group consisting of hydrogen, $C_{1-30}$-alkyl and halogen, wherein $C_{1-30}$-alkyl can be substituted with one to ten substituents independently selected from the group consisting of $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$; and at least two $CH_2$-groups, but not adjacent $CH_2$-groups, of $C_{1-30}$-alkyl can be replaced by O or S, wherein $R^{Sis}$, $R^{Sit}$ $R^{Siu}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—$Si(CH_3)_3$, $R^e$ and $R^f$ are independently selected from the group consisting of H, $C_{2-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, wherein $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;

wherein $R^g$ and $R^h$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and $NO_2$.

3. The polymer of claim 1, wherein $R^1$ is at each occurrence selected from the group consisting of $C_{1-100}$-alkyl, $C_{2-100}$-alkenyl and $C_{2-100}$-alkynyl, wherein $C_{1-100}$-alkyl, $C_{2-100}$-alkenyl and $C_{2-100}$-alkynyl can be substituted with one to forty substituents independently selected from the group consisting of $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—$C(O)R^b$, $C(O)$—$NR^aR^b$, $SR^a$, $Si(R^{Sia})(R^{Sib})(R^{Sic})$, —O—$Si(R^{Sia})(R^{Sib})(R^{Sic})$, halogen, and CN; and at least two $CH_2$-groups, but not adjacent $CH_2$-groups, of $C_{1-100}$-alkyl, $C_{2-100}$-alkenyl and $C_{2-100}$-alkynyl can be replaced by O or S, wherein $R^a$ and $R^b$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl and 5 to 14 membered heteroaryl, $R^{Sia}$, $R^{Sib}$ and $R^{Sic}$ independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, —[O—$SiR^{Sid}R^{Sie}$]$_o$—$R^{Sif}$, wherein o is an integer from 1 to 50, $R^{Sid}$, $R^{Sie}$ and $R^{Sif}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, —[O—$SiR^{Sig}R^{Sih}$]$_p$—$R^{Sii}$, wherein p is an integer from 1 to 50, $R^{Sig}$ $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—$Si(CH_3)_3$, $C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)NR^cR^d$, $SR^c$, $Si(R^{Sij})(R^{Sik})(R^{Sil})$, —O—$Si(R^{Sij})(R^{Sik})(R^{Sil})$, halogen, and CN; and at least two $CH_2$-groups, but not adjacent $CH_2$-groups, of $C_{1-60}$-alkyl, $C_{2-60}$-alkenyl and $C_{2-60}$-alkynyl can be replaced by O or S, $C_{5-8}$-cycloalkyl can be substituted with one to five substituents selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)$—$NR^cR^d$, $SR^c$, $Si(R^{Sij})(R^{Sik})(R^{Sil})$, —O—$Si(R^{Sij})(R^{Sik})(R^{Sil})$, halogen, and CN; and one or two $CH_2$-groups, but not adjacent $CH_2$-groups, of $C_{5-8}$-cycloalkyl can be replaced by O, S, OC(O), CO, $NR^c$ or $NR^c$—CO, $C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)-R^c$, $C(O)-OR^c$, $C(O)-R^c$, $NR^c-C(O)R^d$, $C(O)-NR^cR^d$, $SR^c$, $Si(R^{Sij})(R^{Sik})(R^{Sil})$, $-O-Si(R^{Sij})(R^{Sik})(R^{Sil})$, halogen, and CN;

wherein $R^c$ and $R^d$ are independently selected from the group consisting of H, $C_{1-30}$-alkyl, $C_{2-30}$-alkenyl and $C_{2-30}$-alkynyl, $R^{Sij}$, $R^{Sik}$ and $R^{Sil}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, $-[O-SiR^{Sim}R^{Sin}]_q-R^{Sio}$, wherein q is an integer from 1 to 50, $R^{Sim}$, $R^{Sin}$, $R^{Sio}$ independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, $-[O-SiR^{Sip}R^{Siq}]_r-R^{Sir}$, wherein r is an integer from 1 to 50, $R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, $O-Si(CH_3)_3$, $C_{1-30}$-alkyl, $C_{2-30}$-alkenyl and $C_{2-30}$-alkynyl can be substituted with one to ten substituents selected from the group consisting of halogen and CN, $R^2$ is at each occurrence selected from the group consisting of hydrogen, $C_{1-30}$-alkyl and halogen, wherein $C_{1-30}$-alkyl can be substituted with one to ten substituents independently selected from the group consisting of $C_{5-8}$-cycloalkyl, $C_{6-14}$-aryl, 5 to 14 membered heteroaryl, $OR^e$, $OC(O)-R^e$, $C(O)-OR^e$, $C(O)-R^e$, $NR^eR^f$, $NR^e-C(O)R^f$, $C(O)-NR^eR^f$, $N[C(O)R^e][C(O)R^f]$, $SR^e$, halogen, CN, $SiR^{Sis}R^{Sit}R^{Siu}$ and $NO_2$; and at least two $CH_2$-groups, but not adjacent $CH_2$-groups, of $C_{1-30}$-alkyl can be replaced by O or S, wherein $R^{Sis}$, $R^{Sit}$ and $R^{Siu}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and $O-Si(CH_3)_3$, $R^e$ and $R^f$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, wherein $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^g$, $OC(O)-R^g$, $C(O)-OR^g$, $C(O)-R^g$, $NR^gR^h$, $NR^g-C(O)R^h$, $C(O)-NR^gR^h$, $N[C(O)R^g][C(O)R^h]$, $SR^g$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)-R^g$, $C(O)-OR^g$, $C(O)-R^g$, $NR^gR^h$, $NR^g-C(O)R^h$, $C(O)-NR^gR^h$, $N[C(O)R^g][C(O)R^h]$, $SR^g$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)-R^g$, $C(O)-OR^g$, $C(O)-R^g$, $NR^gR^h$, $NR^g-C(O)R^h$, $C(O)-NR^gR^h$, $N[C(O)R^g][C(O)R^h]$, $SR^g$, halogen, CN, and $NO_2$:

wherein $R^g$ and $R^h$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and $NO_2$.

4. The polymer of claim 1 wherein $R^1$ is at each occurrence selected from the group consisting of $C_{1-36}$-alkyl, $C_{2-36}$-alkenyl and $C_{2-36}$-alkynyl, wherein $C_{1-36}$-alkyl, $C_{2-36}$-alkenyl and $C_{2-36}$-alkynyl can be substituted with one to twenty substituents independently selected from the group consisting of $C_{5-6}$-cycloalkyl, $C_{6-10}$-aryl, 5 to 10 membered heteroaryl, $OR^a$, $SR^a$, $Si(R^{Sia})(R^{Sib})(R^{Sic})$, $-O-Si(R^{Sia})(R^{Sib})(R^{Sic})$, halogen, and CN; and at least two $CH_2$-groups, but not adjacent $CH_2$-groups, of $C_{1-36}$-alkyl, $C_{2-36}$-alkenyl and $C_{2-36}$-alkynyl can be replaced by O or S, wherein $R^a$ is independently selected from the group consisting of H, $C_{1-20}$-alkyl, $C_{2-20}$-alkenyl, $C_{2-20}$-alkynyl, $C_{5-6}$-cycloalkyl and $C_{6-10}$-aryl $R^{Sia}$, $R^{Sib}$ and $R^{Sic}$ are independently selected from the group consisting of H, $C_{1-20}$-M-alkyl, $C_{2-20}$-alkenyl, $C_{2-20}$-alkynyl, $C_{5-6}$-cycloalkyl, $C_{6-10}$-aryl, $-[O-SiR^{Sid}R^{Sie}]_o-R^{Sif}$ wherein o is an integer from 1 to 50, $R^{Sid}$, $R^{Sie}$, $R^{Sif}$ independently selected from the group consisting of H, $C_{1-30}$-alkyl, $C_{2-20}$-alkenyl, $C_{2-20}$-alkynyl, $C_{5-6}$-cycloalkyl, $C_{6-10}$-aryl, $-[O-SiR^{Sig}R^{Sih}]_p-R^{Sii}$, wherein p is an integer from 1 to 50, $R^{Sig}$ $R^{Sih}$, $R^{Sii}$ independently selected from the group consisting of H, $C_{1-20}$-alkyl, $C_{2-20}$-alkenyl, $C_{2-20}$-alkynyl, $C_{5-6}$-cycloalkyl, $C_{6-10}$-aryl, $O-Si(CH_3)_3$, $C_{1-20}$-alkyl, $C_{2-20}$-alkenyl and $C_{2-20}$-alkynyl can be substituted with one to ten substituents selected from the group consisting of halogen and CN, $R^2$ is at each occurrence selected from the group consisting of unsubstituted hydrogen, $C_{1-30}$-alkyl and halogen.

5. The polymer of claim 1, wherein $R^1$ is at each occurrence unsubstituted $C_{1-36}$-alkyl, and $R^2$ is at each occurrence hydrogen.

6. The polymer of claim 1, wherein n is 0, 1 or 2, and m is 0, 1 or 2, with the proviso that at least one of n and m is not 0.

7. A process for preparing the polymer of claim 1, wherein the formula (1) is formula (1-I)

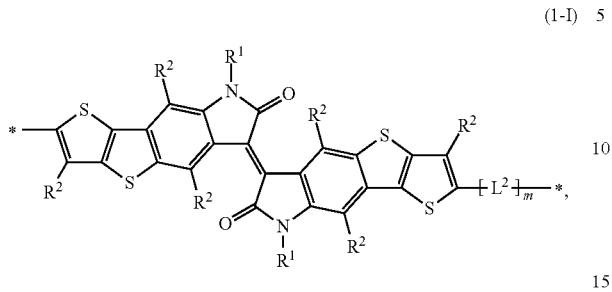
(1-I)

the process comprising:
reacting a compound of formula (2)

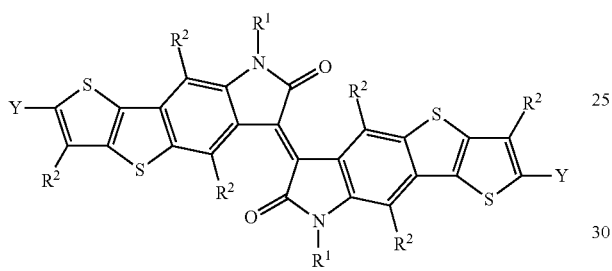
(2)

wherein Y is at each occurrence I, Br, Cl or O—S(O)$_2$CF$_3$, with a compound of formula (3)

$$Z^a\text{---}[L^2]_m\text{---}Z^b \quad (3)$$

wherein $Z^a$ and $Z^b$ are independently selected from the group consisting of B(OZ$^1$)(OZ$^2$), SnZ$^1$Z$^2$Z$^3$,

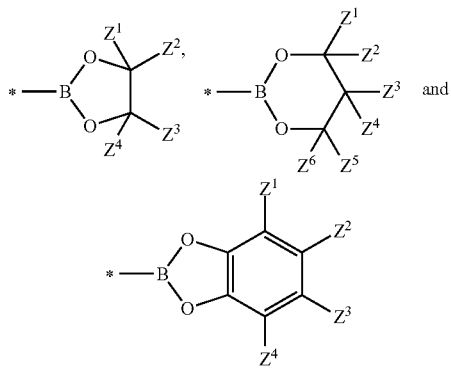

wherein $Z^1$, $Z^2$, $Z^3$, $Z^4$, $Z^5$ and $Z^6$ are independently from each other and at each occurrence H or C$_{1-4}$-alkyl.

8. An electronic device, comprising:
a polymer of claim 1.

9. The electronic device of claim 8, wherein the electronic device is an organic field effect transistor.

* * * * *